United States Patent
Yu et al.

(10) Patent No.: US 8,603,875 B2
(45) Date of Patent: Dec. 10, 2013

(54) CMOS PROCESS TO IMPROVE SRAM YIELD

(75) Inventors: Shaofeng Yu, Plano, TX (US); Russell Carlton McMullan, Allen, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 13/284,519

(22) Filed: Oct. 28, 2011

(65) Prior Publication Data

US 2012/0104510 A1    May 3, 2012

Related U.S. Application Data

(60) Provisional application No. 61/407,811, filed on Oct. 28, 2010.

(51) Int. Cl.
*H01L 21/8238* (2006.01)

(52) U.S. Cl.
USPC .................................. 438/231; 257/E21.638

(58) Field of Classification Search
USPC .................. 438/229, 231, 233; 257/E21.638
See application file for complete search history.

(56) References Cited

U.S. PATENT DOCUMENTS

| | | | |
|---|---|---|---|
| 6,818,489 B2* | 11/2004 | Kim et al. | 438/197 |
| 6,998,674 B2* | 2/2006 | Osada et al. | 257/316 |
| 7,176,522 B2* | 2/2007 | Cheng et al. | 257/338 |

* cited by examiner

*Primary Examiner* — Chandra Chaudhari
(74) *Attorney, Agent, or Firm* — W. James Brady; Frederick J. Telecky, Jr.

(57) ABSTRACT

An integrated circuit containing an SAR SRAM and CMOS logic, in which sidewall spacers on the gate extension of the SAR SRAM cell are thinner than sidewall spacers on the logic PMOS gates, so that the depth of the drain node SRAM PSD layer is maintained under the stretch contact. A process of forming an integrated circuit containing an SAR SRAM and CMOS logic, including selectively etch the sidewall spacers on the on the gate extension of the SAR SRAM cell, so that the depth of the drain node SRAM PSD layer is maintained under the stretch contact. A process of forming an integrated circuit containing an SAR SRAM and CMOS logic, including selectively implanting extra p-type dopants in the drain node SRAM PSD layer, so that the depth of the drain node SRAM PSD layer is maintained under the stretch contact.

18 Claims, 14 Drawing Sheets

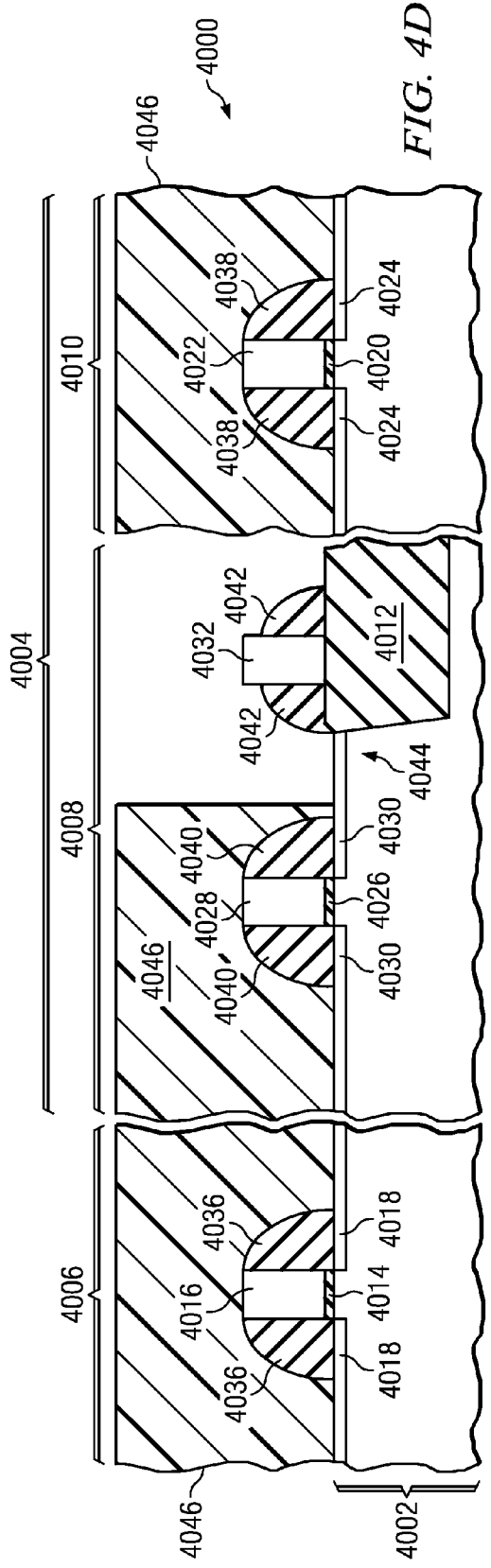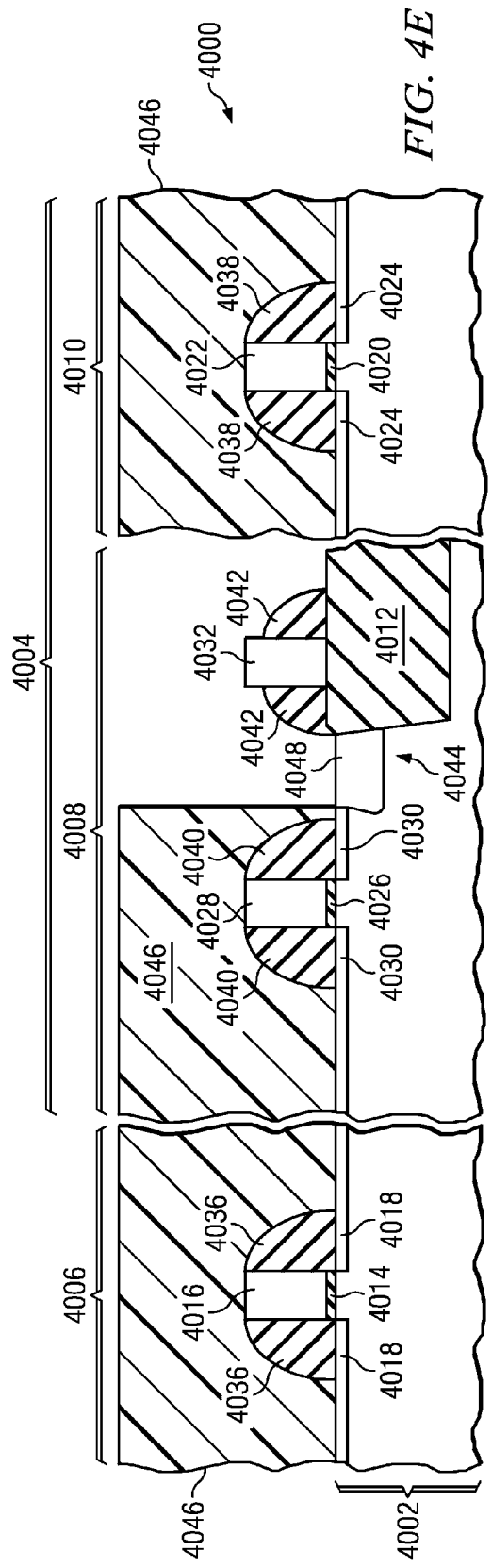

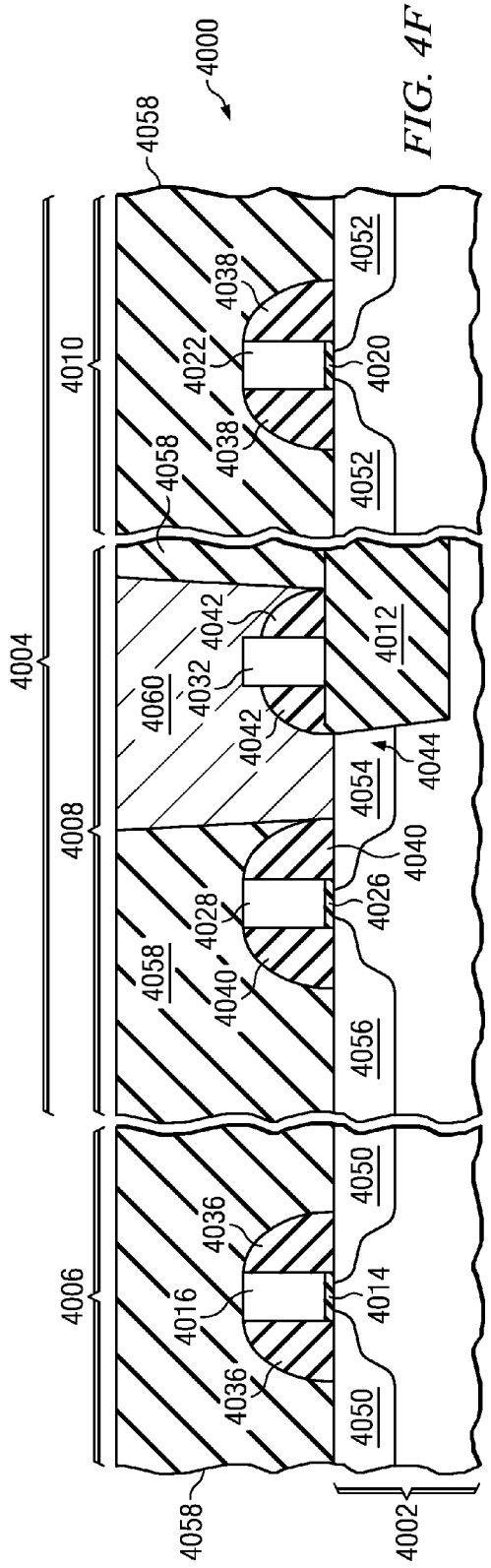
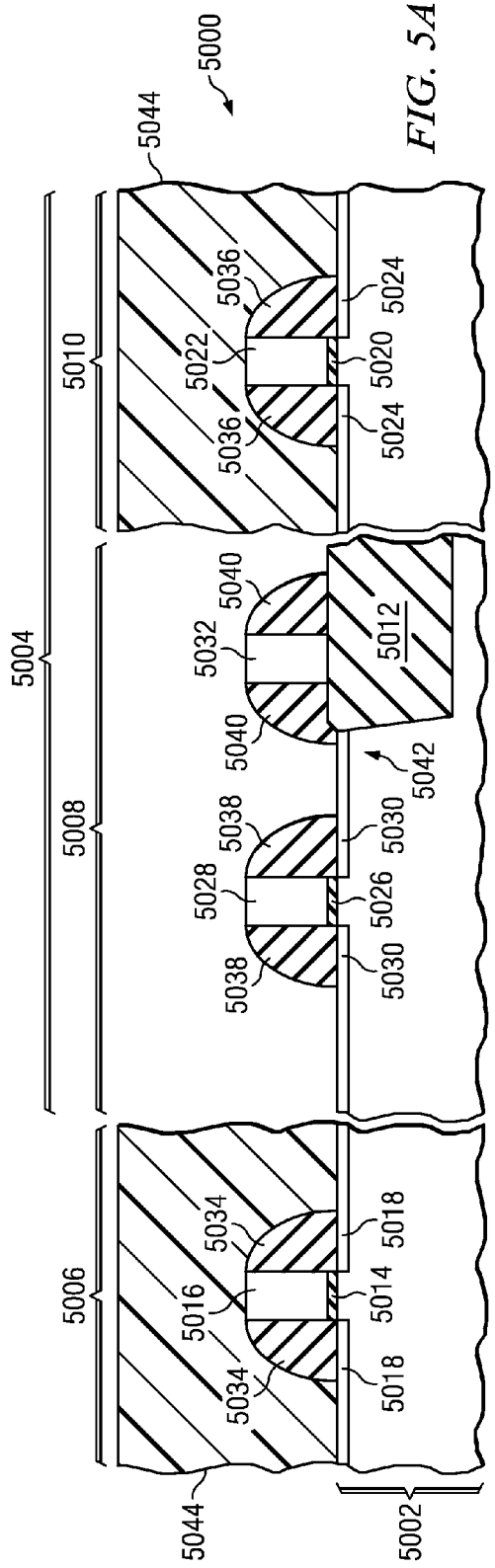
FIG. 4F
FIG. 5A

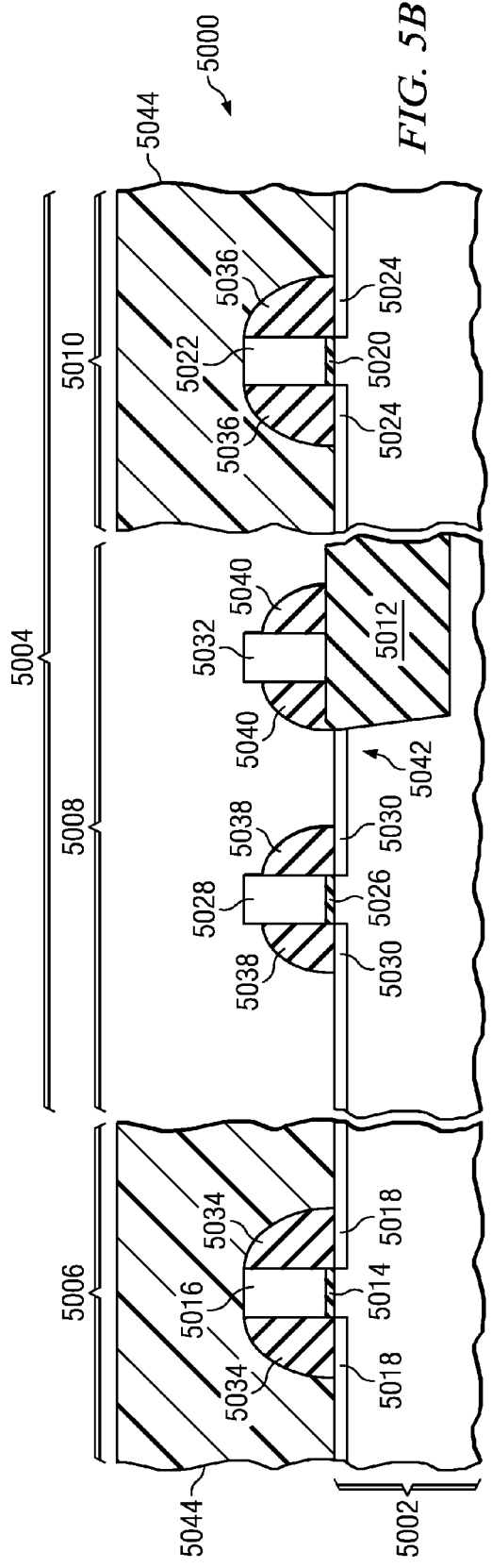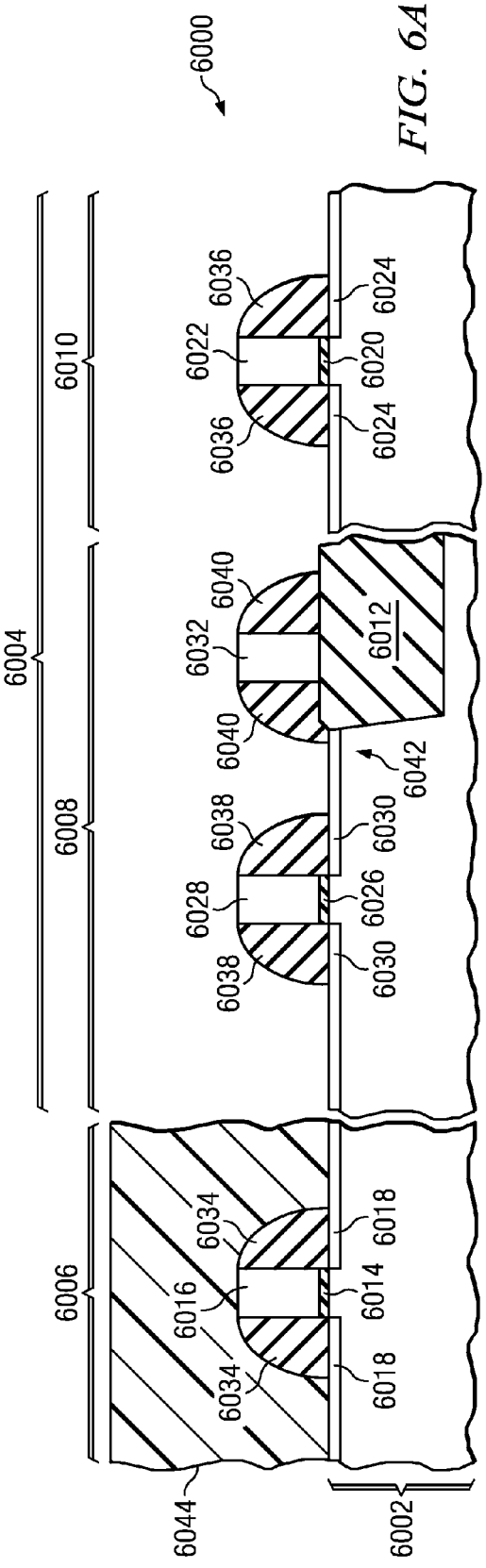

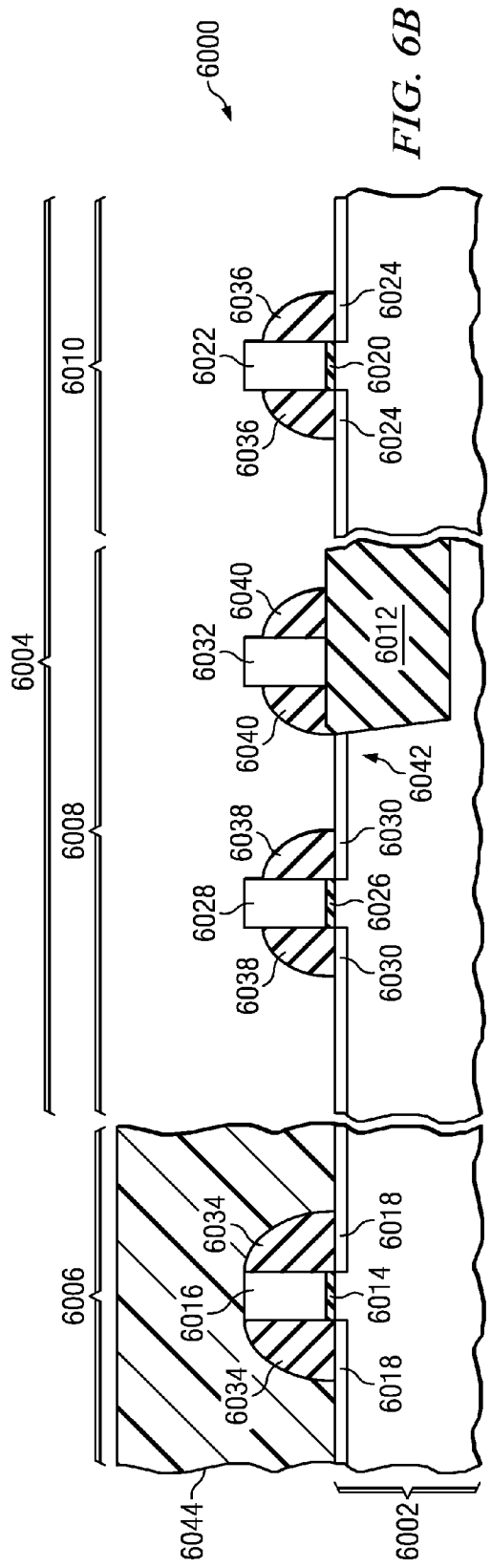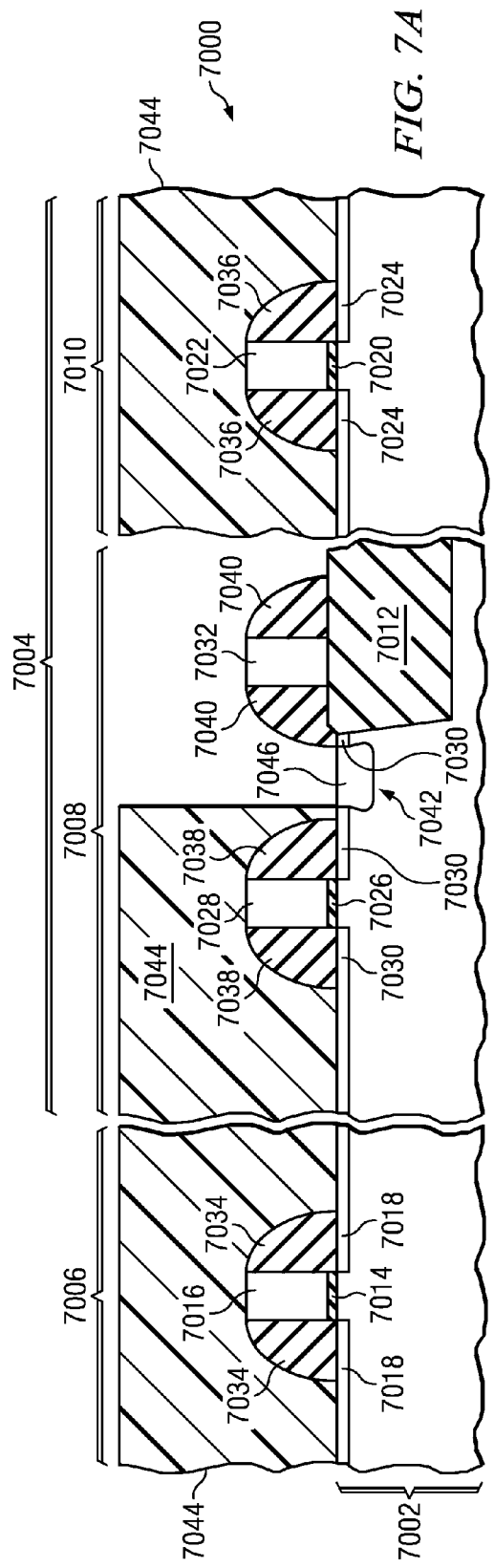

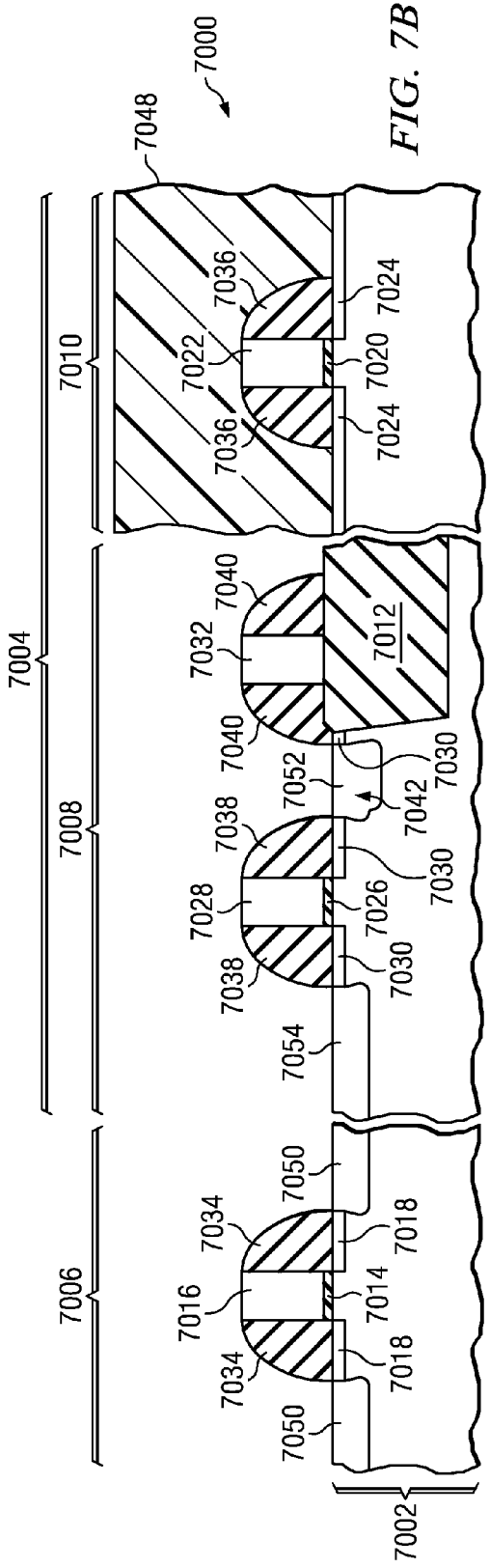
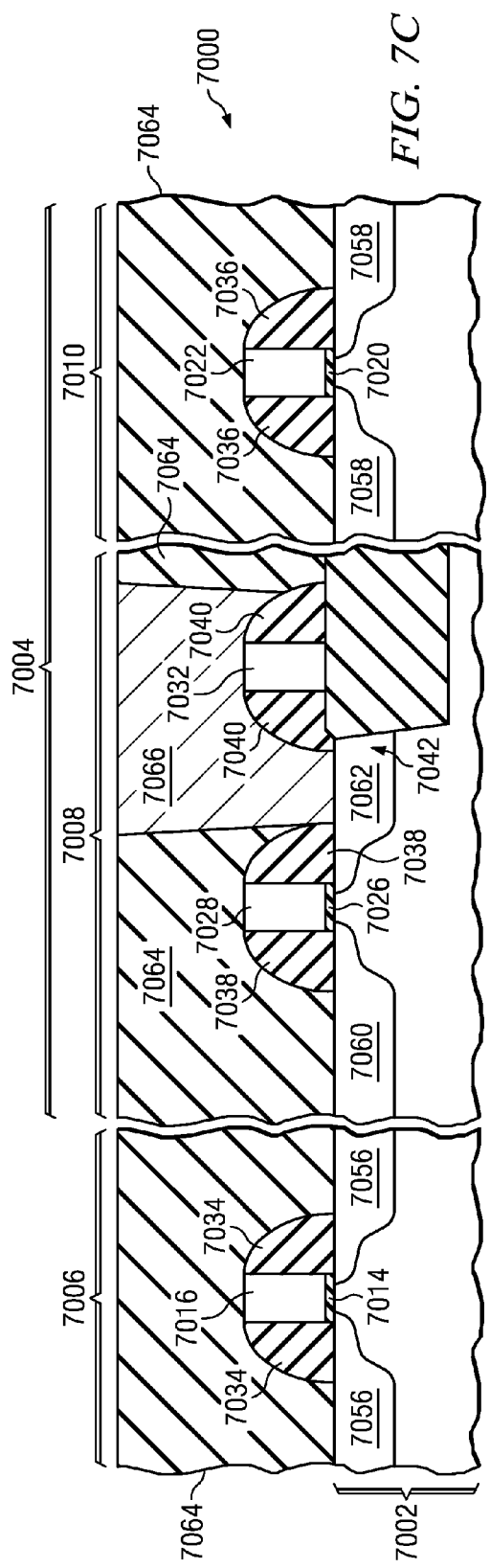

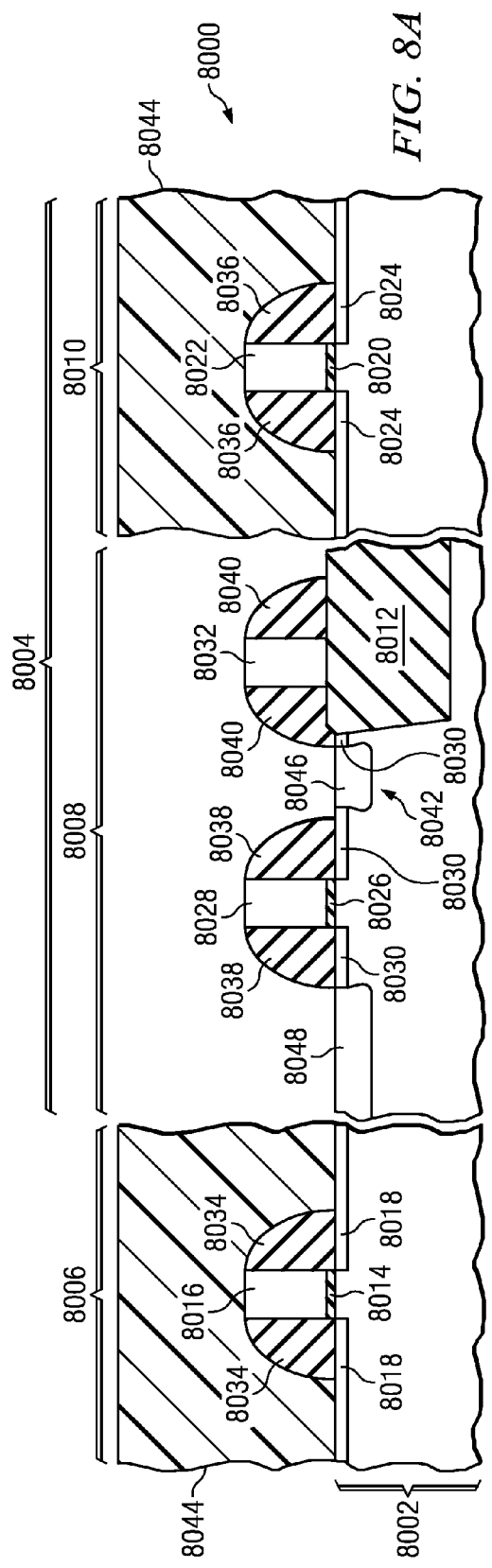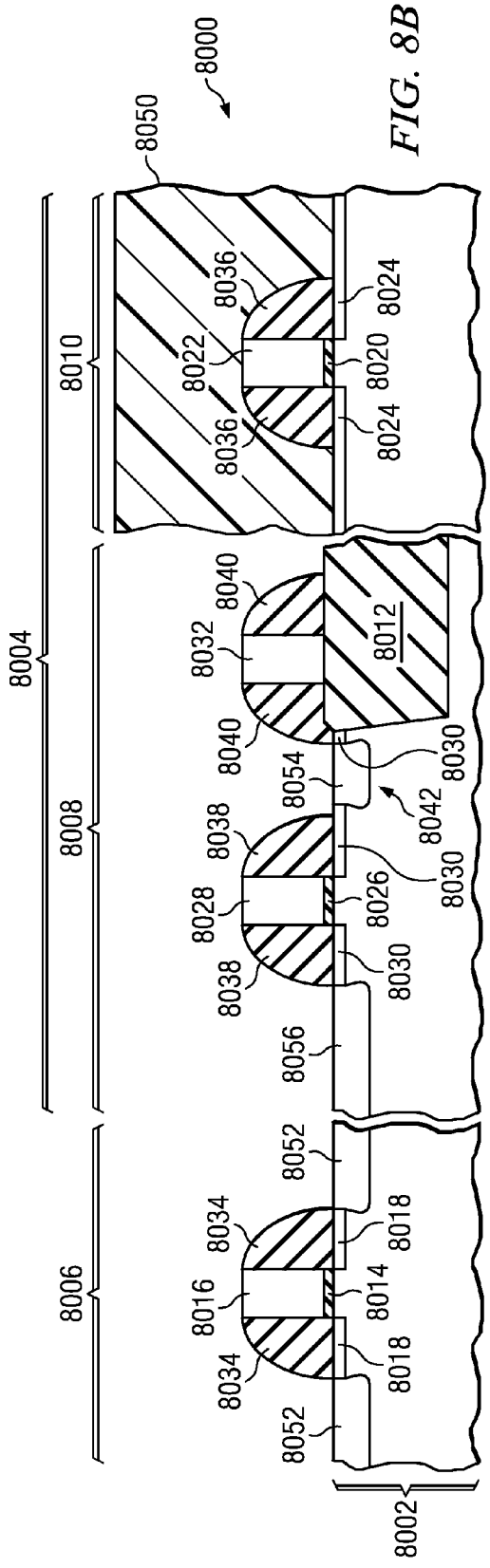

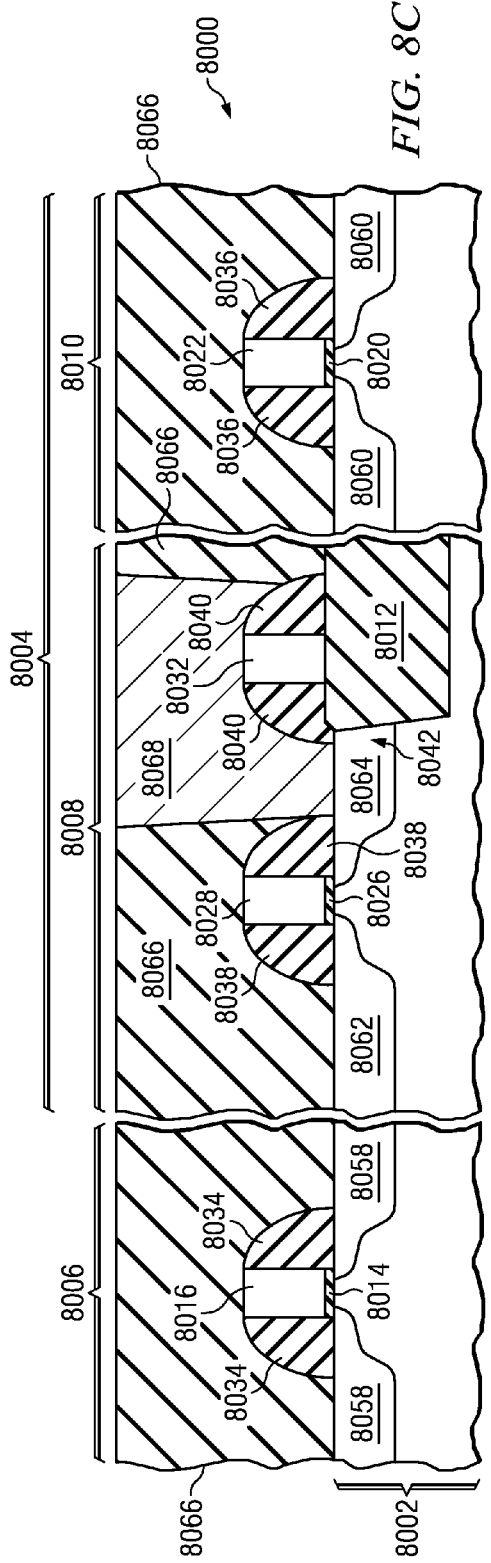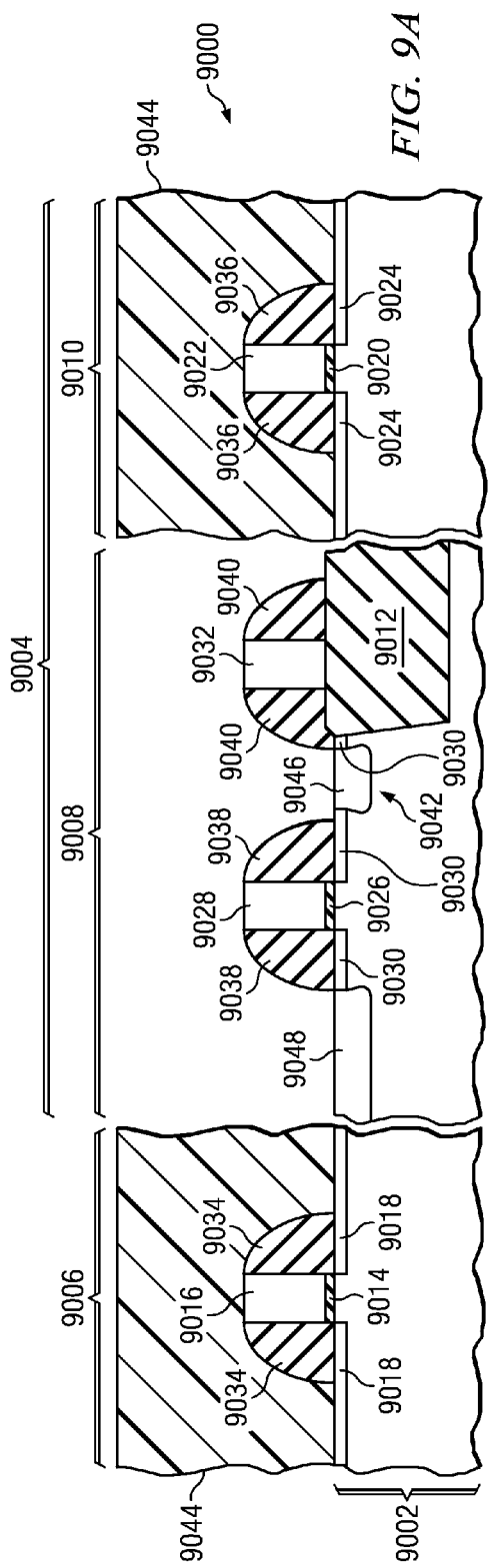

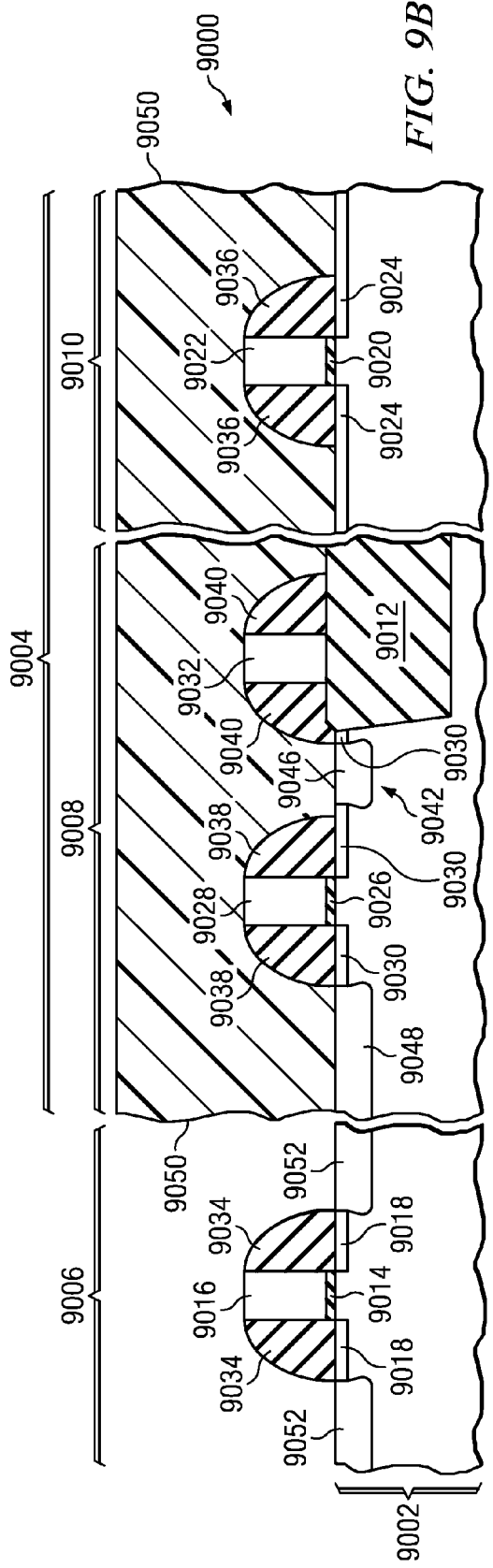
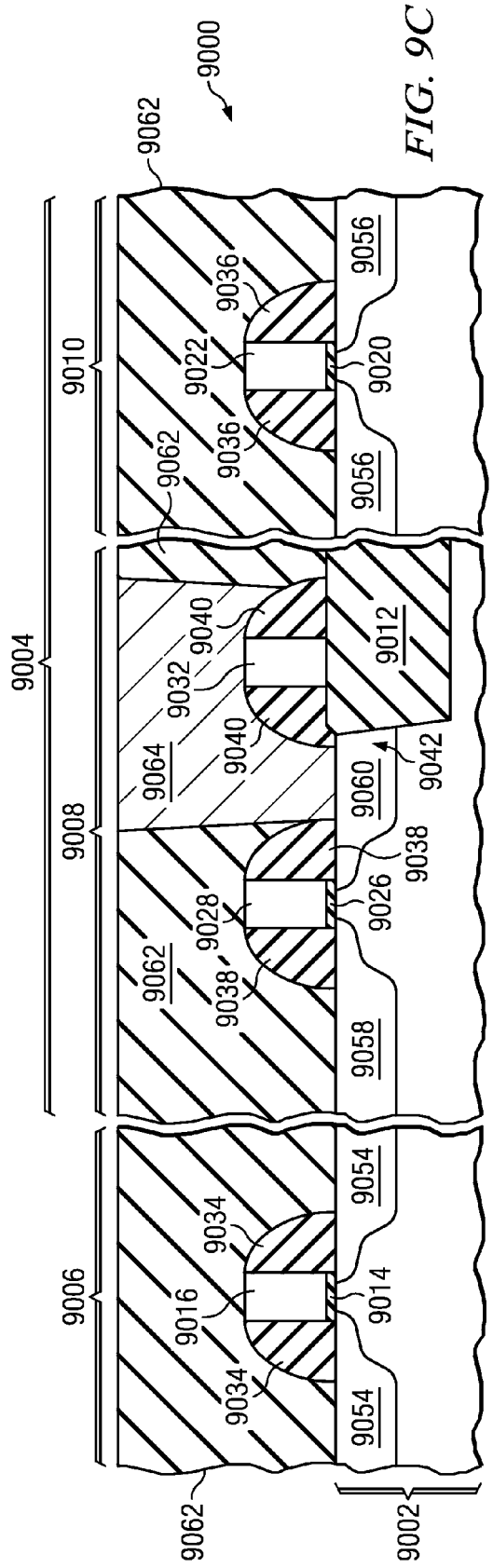
FIG. 9B
FIG. 9C

CMOS PROCESS TO IMPROVE SRAM YIELD

This application claims the benefit of U.S. Provisional Application No. 61/407,811, filed Oct. 28, 2010, the entirety of which is herein incorporated by reference.

FIELD OF THE INVENTION

This invention relates to the field of integrated circuits. More particularly, this invention relates to integrated circuits containing SRAM cells and CMOS logic circuits.

BACKGROUND OF THE INVENTION

An integrated circuit may contain a static random access memory (SRAM) which has a small aspect ration (SAR) cell layout using two stretch contacts in each cell to connect the data node in each inverter to the gate extension of the opposite inverter. Each stretch contact overlaps the gate extension at a location over field oxide. The integrated circuit may also contain n-channel metal oxide semiconductor (NMOS) transistors and p-channel metal oxide semiconductor (PMOS) transistors which are part of complementary metal oxide semiconductor (CMOS) circuits separate from the SRAM. NMOS transistor in the SRAM and NMOS transistors in the CMOS circuits are formed concurrently, and similarly for PMOS transistor in the SRAM and PMOS transistors in the CMOS circuits. The NMOS and PMOS transistors have sidewall spacers adjacent to the gates which provide a desired separation between source/drain regions and channels of the transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an SAR SRAM and separate CMOS circuits may be formed by adjusting the drain regions of the PMOS load transistors in the SRAM so that a depth of each drain region under every point of contact between the stretch contact and the drain region, including metal silicide on the drain region, is at least 75 percent of the maximum depth of that drain region. In one embodiment, a localized etch of the sidewall spacer on the gate extension in the SRAM may be performed to pull back the sidewall spacer prior to implanting p-channel source/drain (PSD) dopants. In another embodiment, the drain regions of the PMOS load transistors in the SRAM may receive additional PSD dopants compared to PMOS transistors in separate CMOS circuits. In a further embodiment, a localized etch of the sidewall spacer on the gate extension may be combined with implanting additional PSD dopants in the SRAM PMOS load transistor drain regions.

DESCRIPTION OF THE VIEWS OF THE DRAWING

FIG. 4A through FIG. 4F are cross sections of an integrated circuit containing an SAR SRAM cell and separate CMOS transistors, formed according to an embodiment, depicted in successive stages of fabrication.

FIG. 5A and FIG. 5B are cross sections of an integrated circuit containing an SAR SRAM cell and separate CMOS transistors, formed according to another embodiment, depicted in successive stages of fabrication.

FIG. 6A and FIG. 6B are cross sections of an integrated circuit containing an SAR SRAM cell and separate CMOS transistors, formed according to another embodiment, depicted in successive stages of fabrication.

FIG. 7A through FIG. 7C are cross sections of an integrated circuit containing an SAR SRAM cell and separate CMOS transistors, formed according to an embodiment, depicted in successive stages of fabrication.

FIG. 8A through FIG. 8C are cross sections of an integrated circuit containing an SAR SRAM cell and separate CMOS transistors, formed according to another embodiment, depicted in successive stages of fabrication.

FIG. 9A through FIG. 9C are cross sections of an integrated circuit containing an SAR SRAM cell and separate CMOS transistors, formed according to another embodiment, depicted in successive stages of fabrication.

DETAILED DESCRIPTION OF EXAMPLE EMBODIMENTS

Figure 1A:
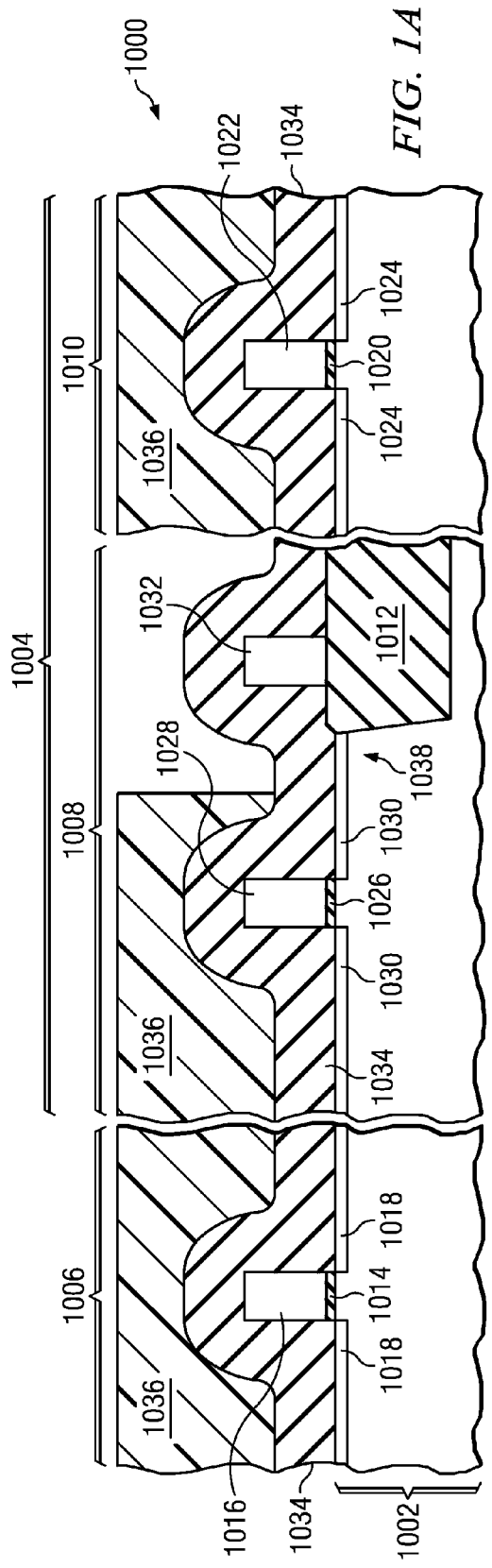
FIG. 1A through FIG. 1E are cross sections of an integrated circuit containing an SAR SRAM cell and separate CMOS transistors, formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include NMOS transistors and PMOS transistors in SAR SRAM cells and in separate CMOS circuits. The SAR SRAM cell includes two inverters having a PMOS load transistor and an NMOS driver transistor in each inverter. A strip of gate material, for example polycrystalline silicon, referred to as polysilicon, metal silicide such as nickel silicide or cobalt silicide, or metal such as titanium nitride, is formed in each inverter of the SAR SRAM cell to overlap a channel area of the NMOS driver and the PMOS load of the inverter and to extend past the PMOS load onto field oxide to provide a gate extension for contact by a stretch contact. The stretch contact overlaps the gate extension and a drain region of the PMOS load transistor of the opposite inverter in the SAR SRAM cell.

The NMOS transistors and PMOS transistors in the SAR SRAM cells and in the separate CMOS circuits have sidewall spacers adjacent to gates of the transistors. The sidewall spacers are formed by forming a layer of sidewall spacer material, for example one or more layers of silicon nitride and/or silicon dioxide, over the gate material and source and drain regions of the transistors, followed by an etchback process which removes sidewall spacer material and leaves the sidewall spacers adjacent to the gate material. Formation of sidewall spacer material on the NMOS and PMOS transistors in the SAR SRAM cells and in the separate CMOS circuits, and at least a portion of the etchback process, is performed concurrently.

An integrated circuit containing an SAR SRAM and separate CMOS circuits may be formed by adjusting the drain regions of the PMOS load transistors in the SRAM so that a depth of each drain region is at least 75 percent of the maximum depth of that drain region under every point of contact between the stretch contact and the drain region. An area of contact between the stretch contact and the drain region includes contact between the stretch contact and any metal silicide on the drain region. In one embodiment, a localized etch of the sidewall spacer on the gate extension in the SRAM may be performed to pull back the sidewall spacer prior to implanting p-channel source/drain (PSD) dopants. The localized etch may be performed by photolithographically forming an etch mask to expose only desired portions of the SAR SRAM cell to a subsequent sidewall etch process. In another embodiment, the drain regions of the PMOS load transistors in the SRAM may receive additional PSD dopants compared to PMOS transistors in separate CMOS circuits. In a further embodiment, a localized etch of the sidewall spacer on the gate extension may be combined with implanting additional PSD dopants in the SRAM PMOS load transistor drain regions.

Integrated circuits formed according to any of the embodiments described herein may have SAR SRAM arrays containing PMOS load transistors with reduced leakage current and less on-state current variation compared to integrated circuits formed using equivalent sidewall spacers and source/drain implants in SAR SRAM cells and logic circuits.

For the purposes of this description, the term "substantially equal" as applied to structures and elements formed in an integrated circuit is understood to mean equal within fabrication tolerances used to fabricate the integrated circuit. The term "logic" is understood to refer to digital circuits, for example adders, multipliers, and decoders, which are separate from memory circuits.

FIG. 1A through FIG. 1E are cross sections of an integrated circuit containing an SAR SRAM cell and separate CMOS transistors, formed according to an embodiment, depicted in successive stages of fabrication. Referring to FIG. 1A, the integrated circuit 1000 is formed in and on a semiconductor substrate 1002 which may be a single crystal silicon wafer, a silicon-on-insulator (SOI) wafer, a hybrid orientation technology (HOT) wafer with regions of different crystal orientations, or other semiconductor material appropriate for fabrication of the integrated circuit 1000. The integrated circuit 1000 includes an SAR SRAM area 1004 and a separate CMOS area 1006. The SAR SRAM area 1004 includes an SRAM PMOS area 1008 and an SRAM NMOS area 1010. Field oxide 1012 is formed in the SRAM PMOS area 1008, for example by a shallow trench isolation (STI) process sequence. The field oxide 1012 may include silicon dioxide, formed by a high density plasma (HDP) or a high aspect ratio process (HARP) operation.

In the CMOS area 1006, a logic PMOS gate dielectric layer 1014, a logic PMOS gate 1016 and possibly logic p-channel lightly doped drain (PLDD) layers 1018 are formed in and on the substrate 1002. In the SRAM NMOS area 1010, an SRAM NMOS gate dielectric layer 1020, an SRAM NMOS gate 1022 and possibly SRAM n-channel lightly doped drain (NLDD) layers 1024 are formed in and on the substrate 1002. In the SRAM PMOS area 1008, an SRAM PMOS gate dielectric layer 1026, an SRAM PMOS gate 1028 and possibly SRAM PLDD layers 1030 are formed in and on the substrate 1002, and an SRAM gate extension 1032 is formed on the field oxide 1012. The gates 1016, 1022 and 1028 and gate extension 1032 may be formed of polycrystalline silicon, referred to as polysilicon, metal silicide such as nickel silicide or cobalt silicide, metal such as titanium nitride, or other electrically conductive material.

A conformal layer of sidewall spacer material 1034 is formed over an existing top surface of the integrated circuit 1000. The sidewall spacer material layer 1034 may include one or more conformal layers of silicon nitride and/or silicon dioxide, formed for example by plasma enhanced chemical vapor deposition (PECVD), low pressure chemical vapor deposition (LPCVD) using hexachlorodisilane and ammonia at 550° C., low temperature deposition using bis (tertiary-butylamino) silane (BTBAS) and ammonia, thermal decomposition of tetraethyl orthosilicate, also known as tetraethoxysilane or TEOS, or other deposition process. In one version of the instant embodiment, the sidewall spacer material layer 1034 may be between 20 and 100 nanometers thick.

A localized SRAM etchback mask 1036 is formed over the sidewall spacer material layer 1034 so as to expose the sidewall spacer material layer 1034 at the SRAM gate extension 1032 and at the substrate 1002 in an SRAM PMOS drain region 1038 between the SRAM PMOS gate 1028 and the field oxide 1012. The localized SRAM etchback mask 1036 may be formed, for example, of photoresist between 100 and 500 nanometers thick. In the instant embodiment, the localized SRAM etchback mask 1036 covers the SRAM PMOS gate 1028, the SRAM NMOS gate 1022 and the logic PMOS gate 1016.

Figure 1B:
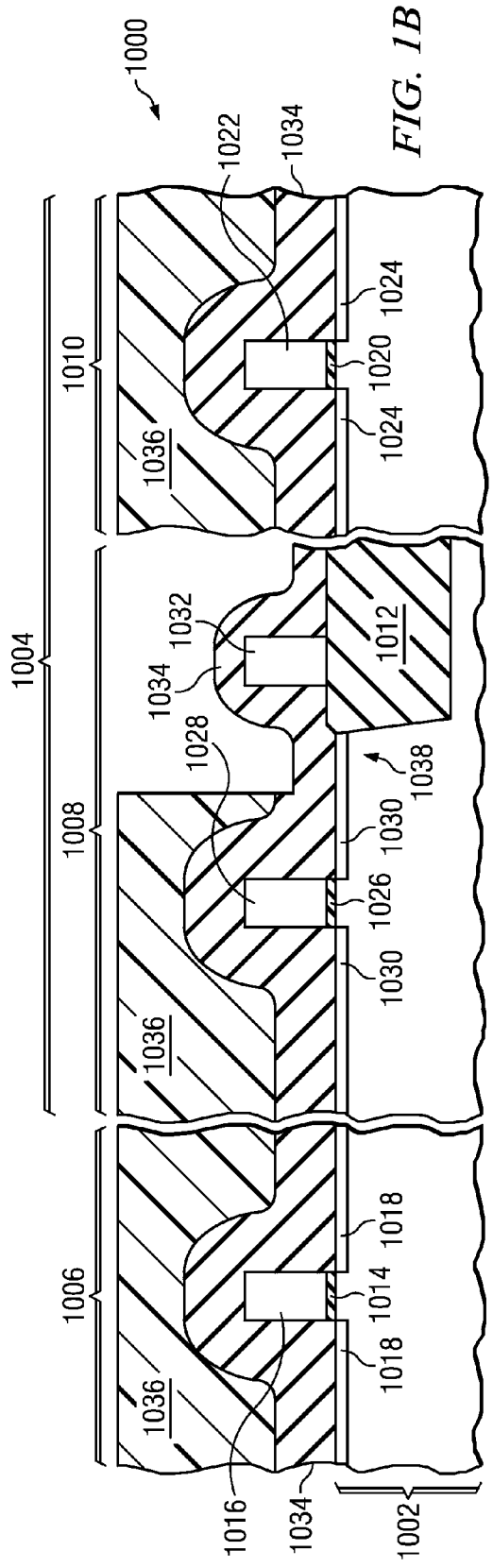

Referring to FIG. 1B, a localized etchback process is performed on the integrated circuit 1000 which removes between 3 and 30 nanometers of sidewall spacer material from the sidewall spacer material layer 1034 in the area exposed by the localized SRAM etchback mask 1036. The localized etchback process may be, for example, a reactive ion etch (RIE) process including a plasma which contains fluorine ions. The localized etchback process may be anisotropic, partially anisotropic or isotropic.

Figure 1C:
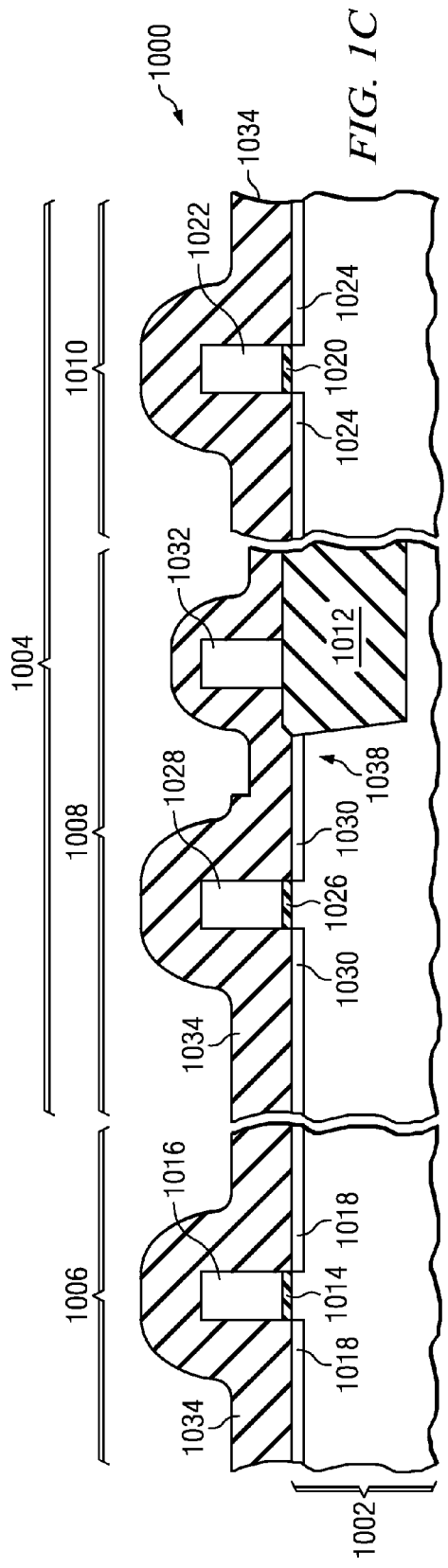

Referring to FIG. 1C, the localized SRAM etchback mask 1036 of FIG. 1B is removed. The localized SRAM etchback mask 1036 may be removed, for example by exposing the integrated circuit 1000 to an oxygen containing plasma, followed by a wet cleanup to remove any organic residue from the top surface of the sidewall spacer material layer 1034.

Figure 1D:
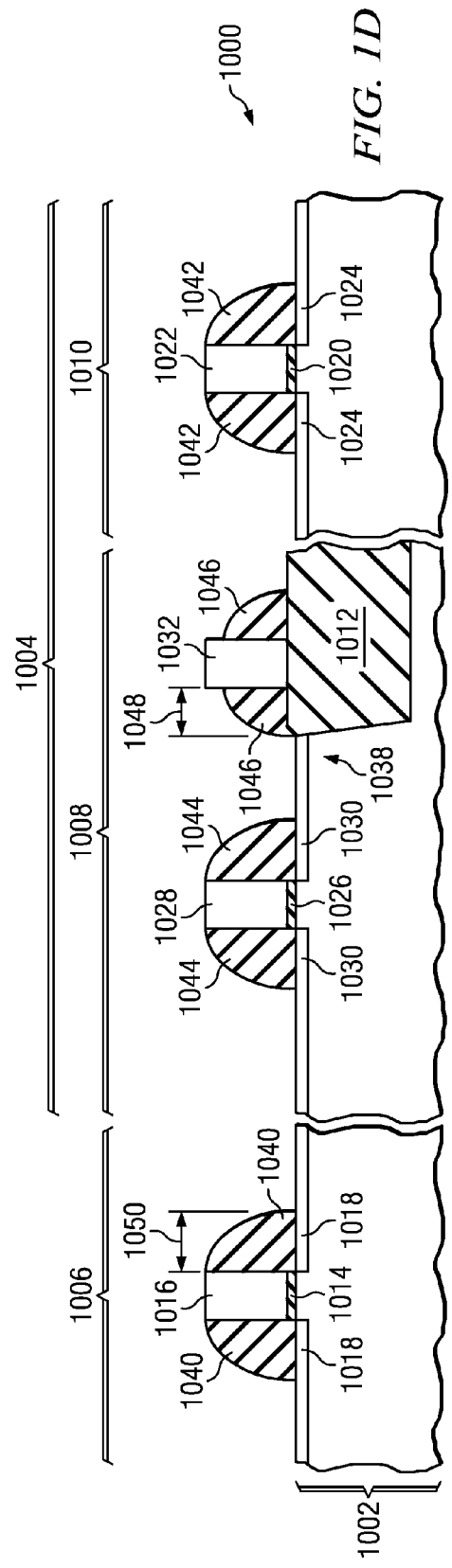

Referring to FIG. 1D, an anisotropic or partially anisotropic sidewall spacer etch process is performed on the integrated circuit 1000 which removes sidewall spacer material from the sidewall spacer material layer 1034 of FIG. 1C on horizontal surfaces of the substrate 1002 and the field oxide 1012 and leaves sidewall spacer material on vertical surfaces at the logic PMOS gate 1016, the SRAM NMOS gate 1022, the SRAM PMOS gate 1028 and the SRAM gate extension 1032 to form logic PMOS sidewall spacers 1040 adjacent to the logic PMOS gate 1016, SRAM NMOS sidewall spacers 1042 adjacent to the SRAM NMOS gate 1022, SRAM PMOS sidewall spacers 1044 adjacent to the SRAM PMOS gate 1028, and SRAM gate extension sidewall spacers 1046 adjacent to the SRAM gate extension 1032. The sidewall spacer etch process may include one or more RIE steps having a plasma containing fluorine ions. In the instant embodiment, a width 1048 of the SRAM gate extension sidewall spacer 1046 adjacent to the SRAM PMOS drain region 1038 is between 3 and 20 nanometers less than a width 1050 of the logic PMOS sidewall spacers 1040.

Figure 1E:
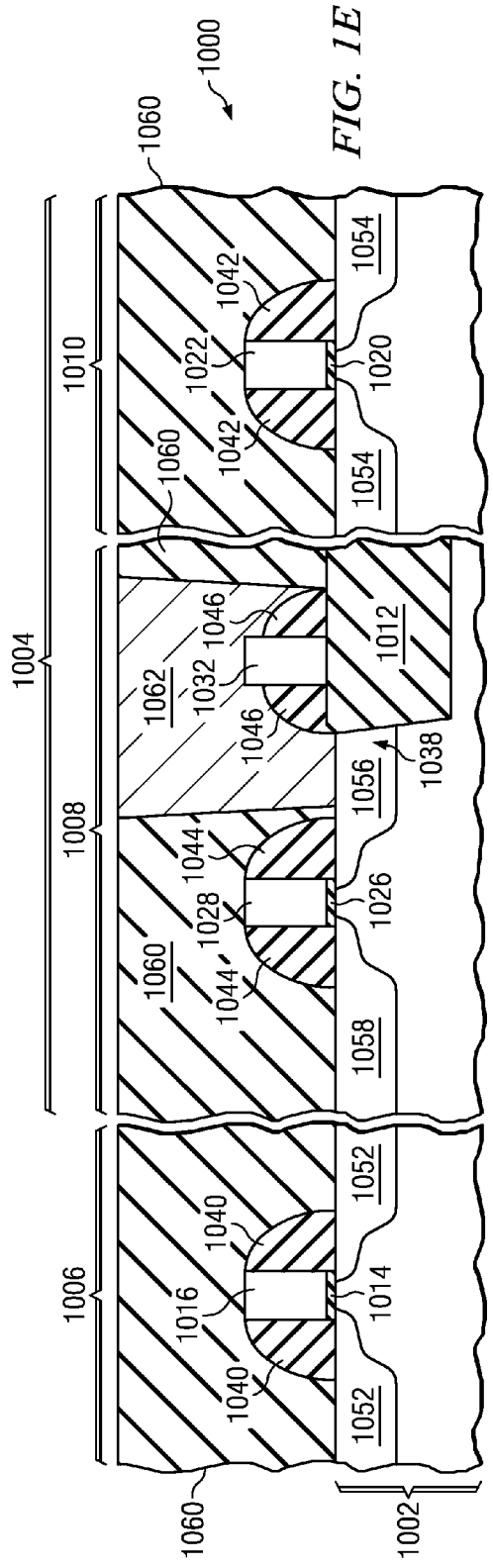

Referring to FIG. 1E, source and drain layers are formed in the substrate 1002 by ion implanting dopants into the substrate 1002 and subsequently annealing the substrate 1002 to electrically activate at least a portion of the implanted dopants. P-type logic PSD layers 1052 are formed adjacent to the logic PMOS gate 1016. N-type n-channel source/drain (NSD) layers 1054 are formed adjacent to the SRAM NMOS gate 1022. A drain node SRAM PSD layer 1056 is formed between the SRAM PMOS gate 1028 and the field oxide 1012. A source node SRAM PSD layer 1058 is formed adjacent to the SRAM PMOS gate 1028 opposite from the drain node SRAM PSD layer 1056. One or more layers of metal silicide, not shown, such as nickel silicide or cobalt silicide may be formed on exposed surfaces of the source and drain layers 1052, 1054, 1056 and 1058 and/or exposed surfaces of the gates 1016, 1022 and 1028 and the gate extension 1032.

A pre-metal dielectric (PMD) layer 1060 is formed over an existing top surface of the integrated circuit 1000. The PMD layer 1060 is a dielectric layer stack including a PMD liner, not shown, a PMD main layer, and an optional PMD cap layer, not shown. The PMD liner is commonly silicon nitride or silicon dioxide, 10 to 100 nanometers thick, deposited by PECVD on the existing top surface of the integrated circuit 1000. The PMD main layer is commonly a layer of silicon dioxide formed by a HARP process followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

A stretch contact 1062 is formed in the PMD layer 1060 which overlaps and electrically contacts the SRAM gate extension 1032 and the drain node SRAM PSD layer 1056. The stretch contact may be formed, for example by etching a contact hole in the PMD layer 1060 to expose the SRAM gate extension 1032 and the drain node SRAM PSD layer 1056 and filling the contact hole with a contact liner metal such as titanium and a contact fill metal such as tungsten. The stretch contact 1062 may be formed concurrently with other contacts, not shown, in the integrated circuit 1000. Performing the localized etchback process as described in reference to FIG. 1B exposes sufficient area of the top surface of the substrate 1002 over the SRAM PMOS drain region 1038 so that a depth of the drain node SRAM PSD layer 1056 is at least 75 percent of the maximum depth of the drain node SRAM PSD layer 1056 under every point of contact between the stretch contact 1062 and the drain node SRAM PSD layer 1056.

Figure 2A:
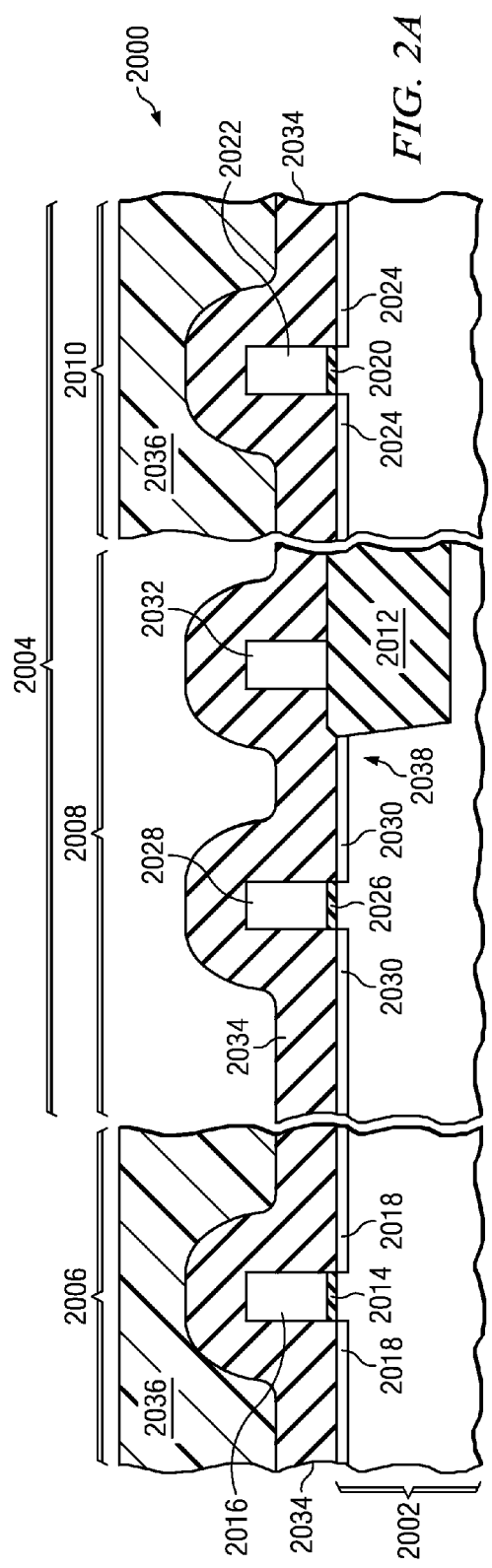
FIG. 2A and FIG. 2B are cross sections of an integrated circuit containing an SAR SRAM cell and separate CMOS transistors, formed according to another embodiment, depicted in successive stages of fabrication.
Figure 2B:
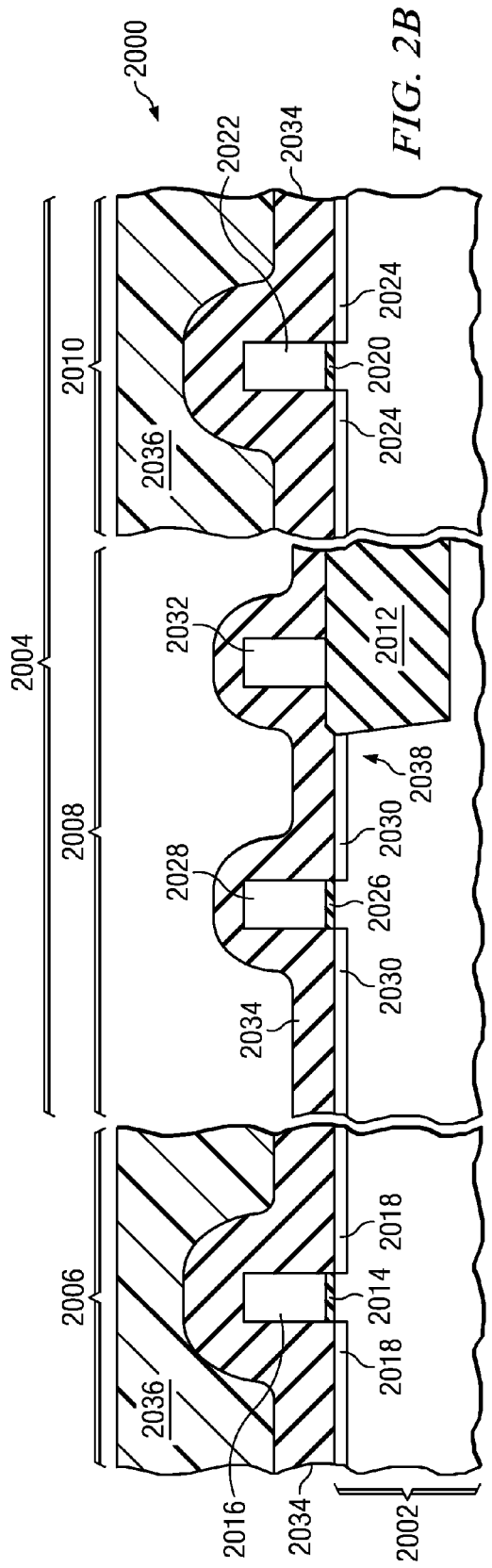

FIG. 2A and FIG. 2B are cross sections of an integrated circuit containing an SAR SRAM cell and separate CMOS transistors, formed according to another embodiment, depicted in successive stages of fabrication. Referring to FIG. 2A, the integrated circuit 2000 is formed in and on a substrate 2002 as described in reference to FIG. 1A. The integrated circuit 2000 includes an SAR SRAM area 2004 and a separate CMOS area 2006. The SAR SRAM area 2004 includes an SRAM PMOS area 2008 and an SRAM NMOS area 2010. Field oxide 2012 is formed in the SRAM PMOS area 2008 as described in reference to FIG. 1A. In the CMOS area 2006, a logic PMOS gate dielectric layer 2014, a logic PMOS gate 2016 and possibly logic PLDD layers 2018 are formed in and on the substrate 2002. In the SRAM NMOS area 2010, an SRAM NMOS gate dielectric layer 2020, an SRAM NMOS gate 2022 and possibly SRAM NLDD layers 2024 are formed in and on the substrate 2002. In the SRAM PMOS area 2008, an SRAM PMOS gate dielectric layer 2026, an SRAM PMOS gate 2028 and possibly SRAM PLDD layers 2030 are formed in and on the substrate 2002, and an SRAM gate extension 2032 is formed on the field oxide 2012.

A conformal layer of sidewall spacer material 2034 is formed over an existing top surface of the integrated circuit 2000 as described in reference to FIG. 1A. A localized SRAM etchback mask 2036 is formed over the sidewall spacer material layer 2034 so as to expose the sidewall spacer material layer 2034 in the SRAM PMOS area 2008, including an SRAM PMOS drain region 2038 in the substrate 2002 between the SRAM PMOS gate 2028 and the SRAM gate extension 2032 adjacent to the field oxide 2012. In the instant embodiment, the localized SRAM etchback mask 2036 covers the SRAM NMOS gate 2022 and the logic PMOS gate 2016.

Referring to FIG. 2B, a localized etchback process is performed on the integrated circuit 2000 which removes between 3 and 30 nanometers of sidewall spacer material from the sidewall spacer material layer 2034 over the SRAM PMOS gate 2028 and the SRAM gate extension 2032. After the localized etchback process is completed, fabrication of the integrated circuit 2000 proceeds as described in reference to FIG. 1C through FIG. 1E.

Figure 3A:
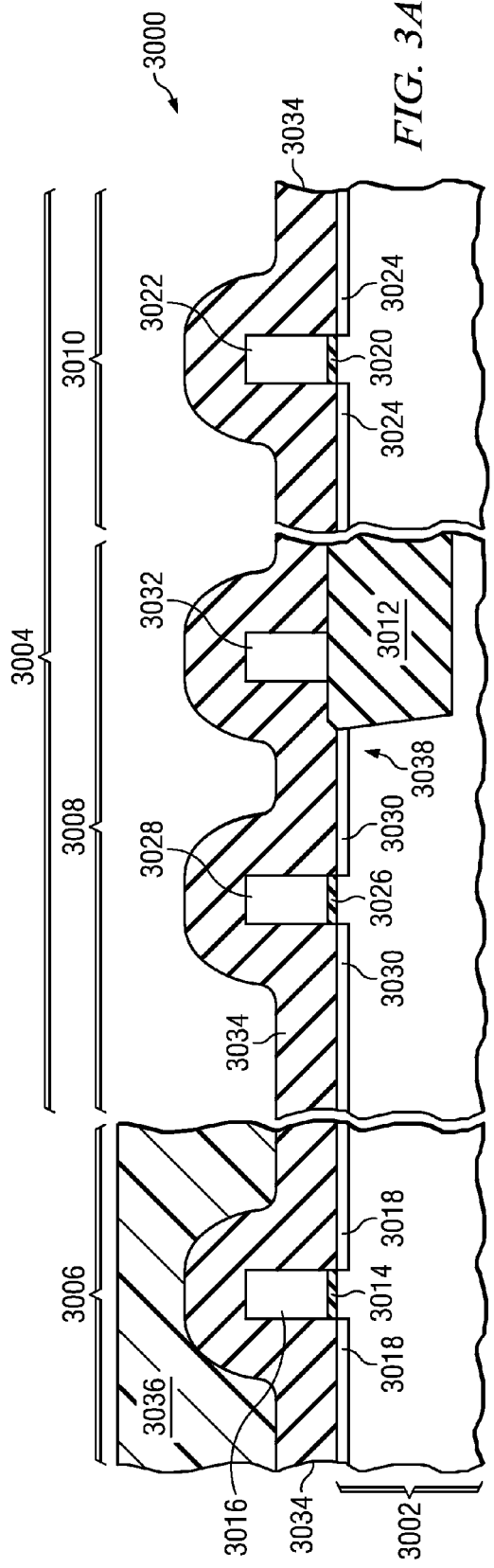
FIG. 3A and FIG. 3B are cross sections of an integrated circuit containing an SAR SRAM cell and separate CMOS transistors, formed according to a further embodiment, depicted in successive stages of fabrication.
Figure 3B:
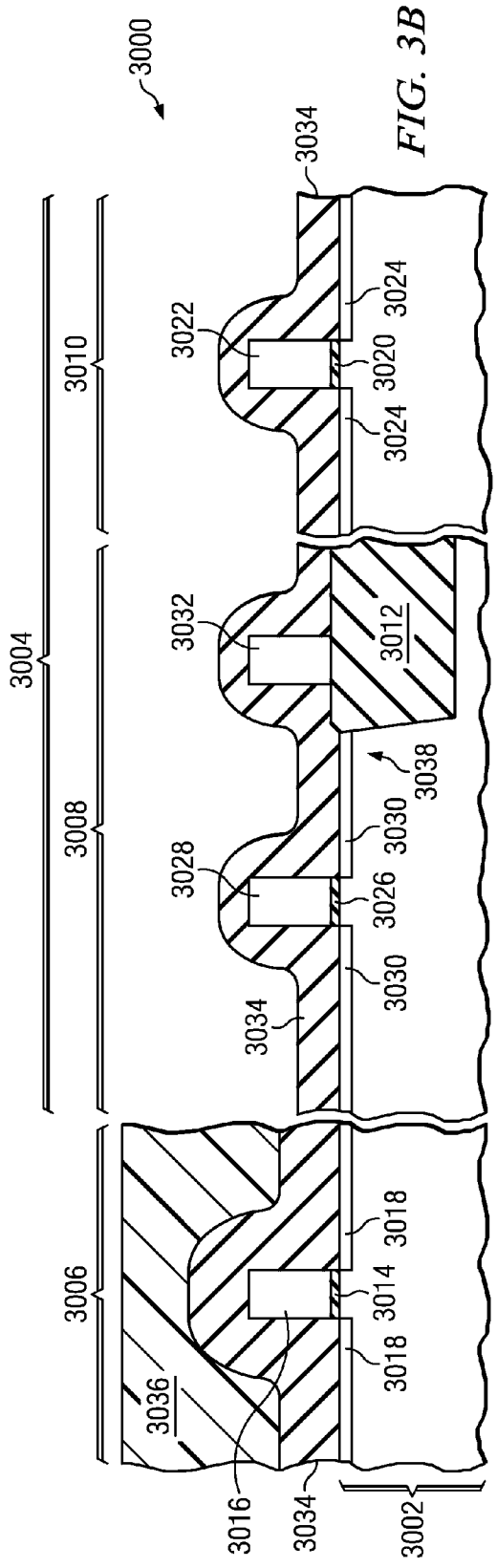

FIG. 3A and FIG. 3B are cross sections of an integrated circuit containing an SAR SRAM cell and separate CMOS transistors, formed according to a further embodiment, depicted in successive stages of fabrication. Referring to FIG. 3A, the integrated circuit 3000 is formed in and on a substrate 3002 as described in reference to FIG. 1A. The integrated circuit 3000 includes an SAR SRAM area 3004 and a separate CMOS area 3006. The SAR SRAM area 3004 includes an SRAM PMOS area 3008 and an SRAM NMOS area 3010. Field oxide 3012 is formed in the SRAM PMOS area 3008 as described in reference to FIG. 1A. In the CMOS area 3006, a logic PMOS gate dielectric layer 3014, a logic PMOS gate 3016 and possibly logic PLDD layers 3018 are formed in and on the substrate 3002. In the SRAM NMOS area 3010, an SRAM NMOS gate dielectric layer 3020, an SRAM NMOS gate 3022 and possibly SRAM NLDD layers 3024 are formed in and on the substrate 3002. In the SRAM PMOS area 3008, an SRAM PMOS gate dielectric layer 3026, an SRAM PMOS gate 3028 and possibly SRAM PLDD layers 3030 are formed in and on the substrate 3002, and an SRAM gate extension 3032 is formed on the field oxide 3012.

A conformal layer of sidewall spacer material 3034 is formed over an existing top surface of the integrated circuit 3000 as described in reference to FIG. 1A. A localized SRAM etchback mask 3036 is formed over the sidewall spacer material layer 3034 so as to expose the sidewall spacer material layer 3034 in the SAR SRAM area 3004, including an SRAM PMOS drain region 3038 in the substrate 3002 between the SRAM PMOS gate 3028 and the SRAM gate extension 3032 adjacent to the field oxide 3012. In the instant embodiment, the localized SRAM etchback mask 1236 covers the logic PMOS gate 3016.

Referring to FIG. 3B, a localized etchback process is performed on the integrated circuit 3000 which removes between 3 and 30 nanometers of sidewall spacer material from the sidewall spacer material layer 3034 over the SRAM PMOS gate 3028, the SRAM gate extension 3032 and the SRAM NMOS gate 3022. After the localized etchback process is completed, fabrication of the integrated circuit 3000 proceeds as described in reference to FIG. 1C through FIG. 1E.

Figure 4A:
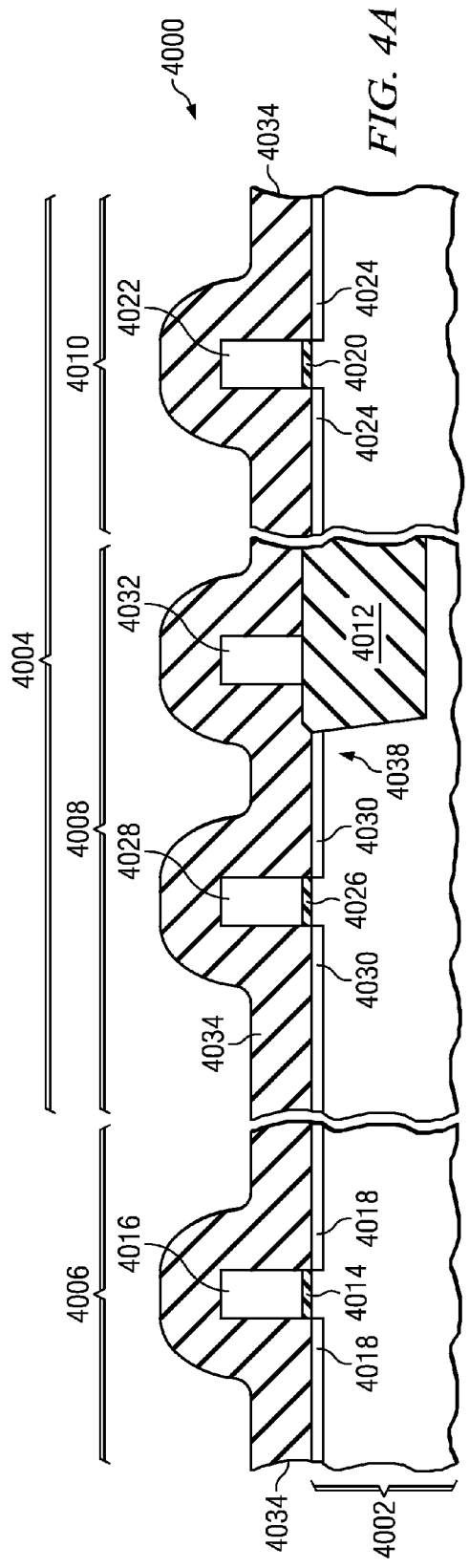

FIG. 4A through FIG. 4F are cross sections of an integrated circuit containing an SAR SRAM cell and separate CMOS transistors, formed according to an embodiment, depicted in successive stages of fabrication. Referring to FIG. 4A, the integrated circuit 4000 is formed in and on a substrate 4002 as described in reference to FIG. 1A. The integrated circuit 4000 includes an SAR SRAM area 4004 and a separate CMOS area 4006. The SAR SRAM area 4004 includes an SRAM PMOS area 4008 and an SRAM NMOS area 4010. Field oxide 4012 is formed in the SRAM PMOS area 4008 as described in reference to FIG. 1A. In the CMOS area 4006, a logic PMOS gate dielectric layer 4014, a logic PMOS gate 4016 and possibly logic PLDD layers 4018 are formed in and on the substrate 4002. In the SRAM NMOS area 4010, an SRAM NMOS gate dielectric layer 4020, an SRAM NMOS gate 4022 and possibly SRAM NLDD layers 4024 are formed in and on the substrate 4002. In the SRAM PMOS area 4008, an SRAM PMOS gate dielectric layer 4026, an SRAM PMOS gate 4028 and possibly SRAM PLDD layers 4030 are formed in and on the substrate 4002, and an SRAM gate extension 4032 is formed on the field oxide 4012. A conformal layer of sidewall spacer material 4034 is formed over an existing top surface of the integrated circuit 4000 as described in reference to FIG. 1A.

Figure 4B:
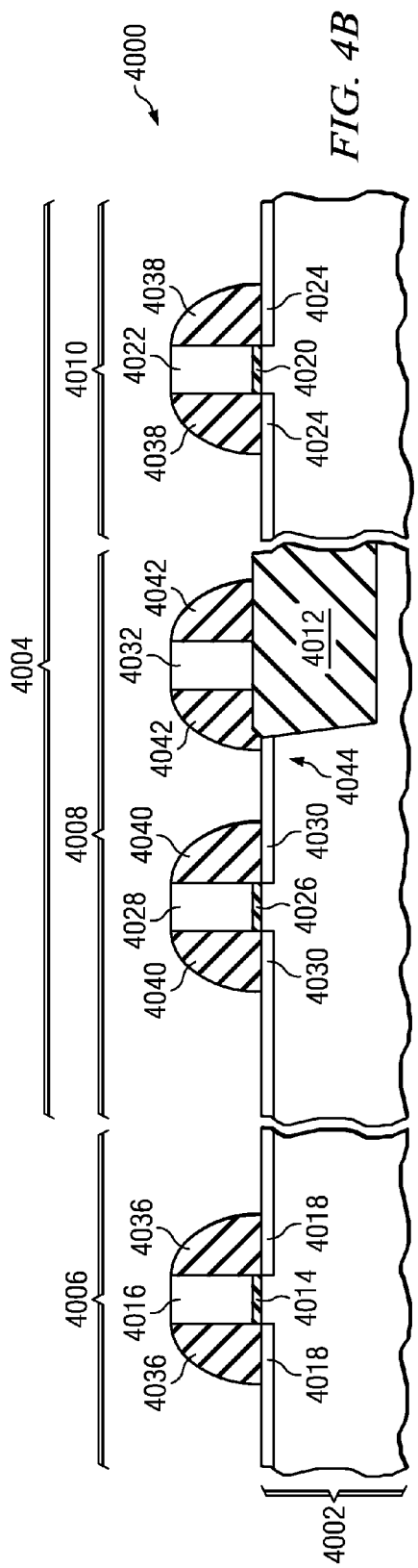

Referring to FIG. 4B, an anisotropic or partially anisotropic sidewall etchback process is performed on the integrated circuit 4000 as described in reference to FIG. 1D which removes sidewall spacer material from the sidewall spacer material layer 4034 of FIG. 4A on horizontal surfaces of the substrate 4002 and the field oxide 4012 and leaves sidewall spacer material on vertical surfaces at the logic PMOS gate 4016, the SRAM NMOS gate 4022, the SRAM PMOS gate 4028 and the SRAM gate extension 4032 to form logic PMOS sidewall spacers 4036 adjacent to the logic PMOS gate 4016, SRAM NMOS sidewall spacers 4038 adjacent to the SRAM NMOS gate 4022, SRAM PMOS sidewall spacers 4040 adjacent to the SRAM PMOS gate 4028, and SRAM gate extension sidewall spacers 4042 adjacent to the SRAM gate extension 4032. The SRAM gate extension sidewall spacer 4042 adjacent to the SRAM PMOS gate 4028 may partially overlap an SRAM PMOS drain region 4044 in the substrate 4002 between the SRAM PMOS gate 4028 and the SRAM gate extension 4032 adjacent to the field oxide 4012.

Figure 4C:
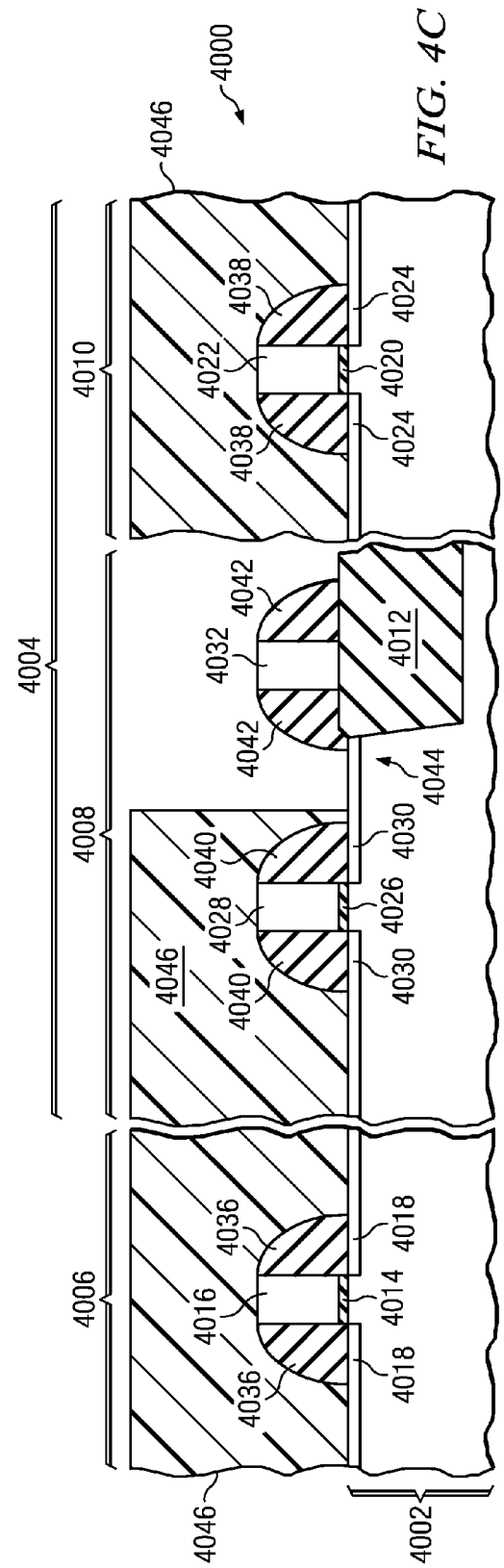

Referring to FIG. 4C, an localized SRAM etchback mask 4046 is formed over an existing top surface of the integrated circuit 4000 as described in reference to FIG. 1A. In the instant embodiment, the localized SRAM etchback mask 4046 exposes the SRAM gate extension sidewall spacers 4042, and covers the logic PMOS sidewall spacers 4036, the SRAM NMOS sidewall spacers 4038 and the SRAM PMOS sidewall spacers 4040.

Referring to FIG. 4D, a localized etchback process is performed on the integrated circuit 4000 which removes between 3 and 30 nanometers of sidewall spacer material from the SRAM gate extension sidewall spacers 4042.

Referring to FIG. 4E, an optional localized SRAM PSD ion implant process may be performed on the integrated circuit 4000 which implants p-type dopants such as boron or gallium into the substrate in the SRAM PMOS drain region 4044 to form an SRAM PMOS drain extra-implanted layer 4048. In one version of the instant embodiment, the localized SRAM PSD ion implant process may implant boron at a dose between $5 \times 10^{14}$ atoms/cm$^2$ and $5 \times 10^{15}$ atoms/cm$^2$, at an energy between 2 keV and 4 keV. In an alternate version, the localized SRAM PSD ion implant process may implant boron difluoride (BF$_2$) at a dose between $3 \times 10^{14}$ molecules/cm$^2$ and $3 \times 10^{15}$ molecules/cm$^2$, at an energy between 5 keV and 20 keV. In another version, the localized SRAM PSD ion implant process may implant boron at a dose at least 50 percent of a subsequent PSD ion implant process which forms PSD layers in the CMOS area 4006. The localized SRAM etchback mask 4046 blocks dopants from the localized SRAM PSD ion implant process in the CMOS area 4006 and the SRAM NMOS area 4010 and where present in the SRAM PMOS area 4008.

Referring to FIG. 4F, source and drain layers are formed in the substrate 4002 as described in reference to FIG. 1E. P-type logic PSD layers 4050 are formed adjacent to the logic PMOS gate 4016. N-type NSD layers 4052 are formed adjacent to the SRAM NMOS gate 4022. A drain node SRAM PSD layer 4054 is formed between the SRAM PMOS gate 4028 and the field oxide 4012. A source node SRAM PSD layer 4056 is formed adjacent to the SRAM PMOS gate 4028 opposite from the drain node SRAM PSD layer 4054. One or more layers of metal silicide, not shown, such as nickel silicide or cobalt silicide may be subsequently formed on exposed surfaces of the source and drain layers 4050, 4052, 4054 and 4056 and/or exposed surfaces of the gates 4016, 4022 and 4028 and the gate extension 4032.

A PMD layer 4058 is formed over an existing top surface of the integrated circuit 4000 as described in reference to FIG. 1E. A stretch contact 4060 is formed in the PMD layer 4058 which contacts the SRAM gate extension 4032 and the drain node SRAM PSD layer 4054, as described in reference to FIG. 1E. In one version of the instant embodiment, performing the localized etchback process as described in reference to FIG. 4D exposes sufficient area of the top surface of the substrate 4002 over the SRAM PMOS drain region 4044 so that a depth of the drain node SRAM PSD layer 4054 is at least 75 percent of the maximum depth of the drain node SRAM PSD layer 4054 under every point of contact between the stretch contact 4060 and the drain node SRAM PSD layer 4054. In another version, performing the localized etchback process in combination with performing the localized SRAM PSD ion implant process as described in reference to FIG. 4E provides sufficient p-type dopants to the SRAM PMOS drain region 4044 so that a depth of the drain node SRAM PSD layer 4054 is at least 75 percent of the maximum depth of the drain node SRAM PSD layer 4054 under every point of contact between the stretch contact 4060 and the drain node SRAM PSD layer 4054.

FIG. 5A and FIG. 5B are cross sections of an integrated circuit containing an SAR SRAM cell and separate CMOS transistors, formed according to another embodiment, depicted in successive stages of fabrication. Referring to FIG. 5A, the integrated circuit 5000 is formed in and on a substrate 5002 as described in reference to FIG. 1A. The integrated circuit 5000 includes an SAR SRAM area 5004 and a separate CMOS area 5006. The SAR SRAM area 5004 includes an SRAM PMOS area 5008 and an SRAM NMOS area 5010. Field oxide 5012 is formed in the SRAM PMOS area 5008 as described in reference to FIG. 1A. In the CMOS area 5006, a logic PMOS gate dielectric layer 5014, a logic PMOS gate 5016 and possibly logic PLDD layers 5018 are formed in and on the substrate 5002. In the SRAM NMOS area 5010, an SRAM NMOS gate dielectric layer 5020, an SRAM NMOS gate 5022 and possibly SRAM NLDD layers 5024 are formed in and on the substrate 5002. In the SRAM PMOS area 5008, an SRAM PMOS gate dielectric layer 5026, an SRAM PMOS gate 5028 and possibly SRAM PLDD layers 5030 are formed in and on the substrate 5002, and an SRAM gate extension 5032 is formed on the field oxide 5012.

Logic PMOS sidewall spacers 5034 are formed adjacent to the logic PMOS gate 5016, SRAM NMOS sidewall spacers 5036 are formed adjacent to the SRAM NMOS gate 5022, SRAM PMOS sidewall spacers 5038 are formed adjacent to the SRAM PMOS gate 5028, and SRAM gate extension sidewall spacers 5040 are formed adjacent to the SRAM gate extension 5032, as described in reference to FIG. 4A and FIG. 4B. The SRAM gate extension sidewall spacer 5040 adjacent to the SRAM PMOS gate 5028 may partially overlap an SRAM PMOS drain region 5042 in the substrate 5002 between the SRAM PMOS gate 5028 and the SRAM gate extension 5032 adjacent to the field oxide 5012. A localized SRAM etchback mask 5044 is formed over an existing top surface of the integrated circuit 5000 as described in reference to FIG. 2A. In the instant embodiment, the localized SRAM etchback mask 5044 exposes the SRAM PMOS area 5008, and covers the CMOS area 5006 and the SRAM NMOS area 5010.

Referring to FIG. 5B, a localized etchback process is performed on the integrated circuit 5000 which removes between 3 and 30 nanometers of sidewall spacer material from the SRAM gate extension sidewall spacers 5040 and the SRAM PMOS sidewall spacers 5038. After the localized etchback process is completed, fabrication of the integrated circuit 5000 proceeds as described in reference to FIG. 4E and FIG. 4F.

FIG. 6A and FIG. 6B are cross sections of an integrated circuit containing an SAR SRAM cell and separate CMOS transistors, formed according to another embodiment, depicted in successive stages of fabrication. Referring to FIG. 6A, the integrated circuit 6000 is formed in and on a substrate 6002 as described in reference to FIG. 1A. The integrated circuit 6000 includes an SAR SRAM area 6004 and a separate CMOS area 6006. The SAR SRAM area 6004 includes an SRAM PMOS area 6008 and an SRAM NMOS area 6010. Field oxide 6012 is formed in the SRAM PMOS area 6008 as described in reference to FIG. 1A. In the CMOS area 6006, a logic PMOS gate dielectric layer 6014, a logic PMOS gate 6016 and possibly logic PLDD layers 6018 are formed in and on the substrate 6002. In the SRAM NMOS area 6010, an SRAM NMOS gate dielectric layer 6020, an SRAM NMOS gate 6022 and possibly SRAM NLDD layers 6024 are formed in and on the substrate 6002. In the SRAM PMOS area 6008, an SRAM PMOS gate dielectric layer 6026, an SRAM PMOS gate 6028 and possibly SRAM PLDD layers 6030 are formed in and on the substrate 6002, and an SRAM gate extension 6032 is formed on the field oxide 6012.

Logic PMOS sidewall spacers 6034 are formed adjacent to the logic PMOS gate 6016, SRAM NMOS sidewall spacers 6036 are formed adjacent to the SRAM NMOS gate 6022, SRAM PMOS sidewall spacers 6038 are formed adjacent to the SRAM PMOS gate 6028, and SRAM gate extension sidewall spacers 6040 are formed adjacent to the SRAM gate extension 6032, as described in reference to FIG. 4A and FIG. 4B. The SRAM gate extension sidewall spacer 6040 adjacent to the SRAM PMOS gate 6028 may partially overlap an SRAM PMOS drain region 6042 in the substrate 6002 between the SRAM PMOS gate 6028 and the SRAM gate extension 6032 adjacent to the field oxide 6012. A localized SRAM etchback mask 6044 is formed over an existing top surface of the integrated circuit 6000 as described in reference to FIG. 2A. In the instant embodiment, the localized SRAM etchback mask 6044 exposes the SAR SRAM area 6004, and covers the CMOS area 6006.

Referring to FIG. 6B, a localized etchback process is performed on the integrated circuit 6000 which removes between 3 and 30 nanometers of sidewall spacer material from the SRAM gate extension sidewall spacers 6040, the SRAM PMOS sidewall spacers 6038 and the SRAM NMOS sidewall spacers 6036. After the localized etchback process is completed, fabrication of the integrated circuit 6000 proceeds as described in reference to FIG. 4E and FIG. 4F.

FIG. 7A through FIG. 7C are cross sections of an integrated circuit containing an SAR SRAM cell and separate CMOS transistors, formed according to an embodiment, depicted in successive stages of fabrication. Referring to FIG. 7A, the integrated circuit 7000 is formed in and on a substrate 7002 as described in reference to FIG. 1A. The integrated circuit 7000 includes an SAR SRAM area 7004 and a separate CMOS area 7006. The SAR SRAM area 7004 includes an SRAM PMOS area 7008 and an SRAM NMOS area 7010. Field oxide 7012 is formed in the SRAM PMOS area 7008 as described in reference to FIG. 1A. In the CMOS area 7006, a logic PMOS gate dielectric layer 7014, a logic PMOS gate 7016 and possibly logic PLDD layers 7018 are formed in and on the substrate 7002. In the SRAM NMOS area 7010, an SRAM NMOS gate dielectric layer 7020, an SRAM NMOS gate 7022 and possibly SRAM NLDD layers 7024 are formed in and on the substrate 7002. In the SRAM PMOS area 7008, an SRAM PMOS gate dielectric layer 7026, an SRAM PMOS gate 7028 and possibly SRAM PLDD layers 7030 are formed in and on the substrate 7002, and an SRAM gate extension 7032 is formed on the field oxide 7012.

Logic PMOS sidewall spacers 7034 are formed adjacent to the logic PMOS gate 7016, SRAM NMOS sidewall spacers 7036 are formed adjacent to the SRAM NMOS gate 7022, SRAM PMOS sidewall spacers 7038 are formed adjacent to the SRAM PMOS gate 7028, and SRAM gate extension sidewall spacers 7040 are formed adjacent to the SRAM gate extension 7032, as described in reference to FIG. 4A and FIG. 4B. The SRAM gate extension sidewall spacer 7040 adjacent to the SRAM PMOS gate 7028 may partially overlap an SRAM PMOS drain region 7042 in the substrate 7002 between the SRAM PMOS gate 7028 and the SRAM gate extension 7032 adjacent to the field oxide 7012.

A localized SRAM PSD ion implant mask 7044 is formed over an existing top surface of the integrated circuit 7000. The localized SRAM PSD ion implant mask 7044 may be formed, for example, of photoresist between 200 and 600 nanometers thick. In the instant embodiment, the localized SRAM PSD ion implant mask 7044 exposes at least a portion of the SRAM PMOS drain region 7042, and covers the CMOS area 7006, the SRAM PMOS gate 7028 and the SRAM NMOS area 7010.

A localized SRAM PSD ion implant process is performed on the integrated circuit 7000 which implants p-type dopants such as boron or gallium into the substrate in the SRAM PMOS drain region 7042 to form an SRAM PMOS drain extra-implanted layer 7046. In one version of the instant embodiment, the localized SRAM PSD ion implant process may implant boron at a dose between $5 \times 10^{14}$ atoms/cm$^2$ and $5 \times 10^{15}$ atoms/cm$^2$, at an energy between 2 keV and 4 keV. In an alternate version, the localized SRAM PSD ion implant process may implant BF$_2$ at a dose between $3 \times 10^{14}$ molecules/cm² and 3×10¹⁵ molecules/cm², at an energy between 5 keV and 20 keV. In another version, the localized SRAM PSD ion implant process may implant boron at a dose at least 50 percent of a subsequent PSD ion implant process which forms PSD layers in the CMOS area 7006. The localized SRAM PSD ion implant mask 7044 blocks dopants from the localized SRAM PSD ion implant process in the CMOS area 7006 and the SRAM NMOS area 7010 and where present in the SRAM PMOS area 7008. After the localized SRAM PSD ion implant process is completed, the localized SRAM PSD ion implant mask 7044 is removed, for example by exposing the integrated circuit 7000 to an oxygen containing plasma, followed by a wet cleanup to remove any organic residue.

Referring to FIG. 7B, a PSD ion implant mask 7048 is formed over an existing top surface of the integrated circuit 7000 so as to expose PMOS transistors in the CMOS area 7006 and the SRAM PMOS area 7008. A PSD ion implant process is performed on the integrated circuit which implants p-type dopants into the substrate to form p-type logic PSD implanted layers 7050 adjacent to the logic PMOS gate 7016, a drain node SRAM PSD implanted layer 7052 between the SRAM PMOS gate 7028 and the field oxide 7012, and a source node SRAM PSD implanted layer 7054 adjacent to the SRAM PMOS gate 7028 opposite from the drain node SRAM PSD implanted layer 7052. The p-type dopants of the PSD ion implant process are blocked from the SRAM NMOS area 7010 by the PSD ion implant mask 7048. After the PSD ion implant process is completed, the PSD ion implant mask 7048 is removed.

Referring to FIG. 7C, NSD implanted layers, not shown, are formed in the substrate 7002 adjacent to the SRAM NMOS gate 7022. A source/drain anneal operation is performed on the integrated circuit 7000 which heats the substrate 7002 so as to electrically activate at least a portion of the dopants in the logic PSD implanted layers 7050, the drain node SRAM PSD implanted layer 7052 and the source node SRAM PSD implanted layer 7054 of FIG. 7B and the NSD implanted layers. In one version of the instant embodiment, the source/drain anneal may be a rapid thermal anneal process which heats the substrate 7002 using radiant heaters to a temperature between 900° C. and 1100° C. for a time period between 5 seconds and 30 seconds. In another version, the source/drain anneal may be a rapid thermal spike anneal process which heats the substrate 7002 to a temperature between 1050° C. and 1150° C. for a time period between 300 milliseconds and 3 seconds. In a further version, the source/drain anneal may be a laser anneal process which heats the substrate 7002 using a laser to a temperature between 1150° C. and 1250° C. for a time period between 10 microseconds and 300 microseconds. In an alternate version, the source/drain anneal may be a laser spike anneal process which heats the substrate 7002 using a laser to a temperature between 1250° C. and 1550° C. for a time period between 10 nanoseconds and 10 microseconds. Dopants in the logic PLDD layers 7018 and the logic PSD implanted layers 7050 form logic PSD layers 7056. Dopants in the SRAM NLDD layers 7024 and the NSD implanted layers form SRAM NSD layers 7058. Dopants in a source side of the SRAM PLDD layers 7030 and in the source node SRAM PSD implanted layer 7054 form a source node SRAM PSD layer 7060. Dopants in a drain side of the SRAM PLDD layers 7030 and in the drain node SRAM PSD implanted layer 7052 form a drain node SRAM PSD layer 7062. One or more layers of metal silicide, not shown, such as nickel silicide or cobalt silicide may be subsequently formed on exposed surfaces of the source and drain layers 7056, 7058, 7060 and 7062 and/or exposed surfaces of the gates 7016, 7022 and 7028 and the gate extension 7032.

A PMD layer 7064 is formed over an existing top surface of the integrated circuit 7000 as described in reference to FIG. 1E. A stretch contact 7066 is formed in the PMD layer 7064 which contacts the SRAM gate extension 7032 and the drain node SRAM PSD layer 7062, as described in reference to FIG. 1E. Performing the localized SRAM PSD ion implant process as described in reference to FIG. 7A provides sufficient p-type dopants to the SRAM PMOS drain region 7042 so that a depth of the drain node SRAM PSD layer 7062 is at least 75 percent of the maximum depth of the drain node SRAM PSD layer 7062 under every point of contact between the stretch contact 7066 and the drain node SRAM PSD layer 7062.

FIG. 8A and FIG. 8B are cross sections of an integrated circuit containing an SAR SRAM cell and separate CMOS transistors, formed according to another embodiment, depicted in successive stages of fabrication. Referring to FIG. 8A, the integrated circuit 8000 is formed in and on a substrate 8002 as described in reference to FIG. 1A. The integrated circuit 8000 includes an SAR SRAM area 8004 and a separate CMOS area 8006. The SAR SRAM area 8004 includes an SRAM PMOS area 8008 and an SRAM NMOS area 8010. Field oxide 8012 is formed in the SRAM PMOS area 8008 as described in reference to FIG. 1A. In the CMOS area 8006, a logic PMOS gate dielectric layer 8014, a logic PMOS gate 8016 and possibly logic PLDD layers 8018 are formed in and on the substrate 8002. In the SRAM NMOS area 8010, an SRAM NMOS gate dielectric layer 8020, an SRAM NMOS gate 8022 and possibly SRAM NLDD layers 8024 are formed in and on the substrate 8002. In the SRAM PMOS area 8008, an SRAM PMOS gate dielectric layer 8026, an SRAM PMOS gate 8028 and possibly SRAM PLDD layers 8030 are formed in and on the substrate 8002, and an SRAM gate extension 8032 is formed on the field oxide 8012.

Logic PMOS sidewall spacers 8034 are formed adjacent to the logic PMOS gate 8016, SRAM NMOS sidewall spacers 8036 are formed adjacent to the SRAM NMOS gate 8022, SRAM PMOS sidewall spacers 8038 are formed adjacent to the SRAM PMOS gate 8028, and SRAM gate extension sidewall spacers 8040 are formed adjacent to the SRAM gate extension 8032, as described in reference to FIG. 4A and FIG. 4B. The SRAM gate extension sidewall spacer 8040 adjacent to the SRAM PMOS gate 8028 may partially overlap an SRAM PMOS drain region 8042 in the substrate 8002 between the SRAM PMOS gate 8028 and the SRAM gate extension 8032 adjacent to the field oxide 8012.

A localized SRAM PSD ion implant mask 8044 is formed over an existing top surface of the integrated circuit 8000, as described in reference to FIG. 7A. In the instant embodiment, the localized SRAM PSD ion implant mask 8044 exposes the SRAM PMOS area 8008, and covers the CMOS area 8006 and the SRAM NMOS area 8010. A localized SRAM PSD ion implant process is performed on the integrated circuit 8000 which implants p-type dopants such as boron or gallium into the substrate in the SRAM PMOS area 8008 to form an SRAM PMOS drain extra-implanted layer 8046 and an SRAM PMOS source extra-implanted layer 8048. In one version of the instant embodiment, the localized SRAM PSD ion implant process may implant boron at a dose between 5×10¹⁴ atoms/cm² and 5×10¹⁵ atoms/cm², at an energy between 2 keV and 4 keV. In an alternate version, the localized SRAM PSD ion implant process may implant BF₂ at a dose between 3×10¹⁴ molecules/cm² and 3×10¹⁵ molecules/cm², at an energy between 5 keV and 20 keV. In another version, the localized SRAM PSD ion implant process may implant boron at a dose at least 50 percent of a subsequent PSD ion implant process which forms PSD layers in the CMOS area 8006. The localized SRAM PSD ion implant mask 8044 blocks dopants from the localized SRAM PSD ion implant process in the CMOS area 8006 and the SRAM NMOS area 8010. After the localized SRAM PSD ion implant process is completed, the localized SRAM PSD ion implant mask 8044 is removed.

Referring to FIG. 8B, a PSD ion implant mask 8050 is formed over an existing top surface of the integrated circuit 8000 so as to expose PMOS transistors in the CMOS area 8006 and the SRAM PMOS area 8008. A PSD ion implant process is performed on the integrated circuit which implants p-type dopants into the substrate to form p-type logic PSD implanted layers 8052 adjacent to the logic PMOS gate 8016, a drain node SRAM PSD implanted layer 8054 at the SRAM PMOS drain extra-implanted layer 8046 of FIG. 8A, and a source node SRAM PSD implanted layer 8056 at the SRAM PMOS source extra-implanted layer 8048. The p-type dopants of the PSD ion implant process are blocked from the SRAM NMOS area 8010 by the PSD ion implant mask 8050. After the PSD ion implant process is completed, the PSD ion implant mask 8050 is removed.

Referring to FIG. 8C, NSD implanted layers, not shown, are formed in the substrate 8002 adjacent to the SRAM NMOS gate 8022. A source/drain anneal operation is performed on the integrated circuit 8000 as described in reference to FIG. 7C which heats the substrate 8002 so as to electrically activate at least a portion of the dopants in the logic PSD implanted layers 8052, the drain node SRAM PSD implanted layer 8054 and the source node SRAM PSD implanted layer 8056 of FIG. 8B and the NSD implanted layers. Dopants in the logic PLDD layers 8018 and the logic PSD implanted layers 8052 form logic PSD layers 8058. Dopants in the SRAM NLDD layers 8024 and the NSD implanted layers form SRAM NSD layers 8060. Dopants in a source side of the SRAM PLDD layers 8030 and in the source node SRAM PSD implanted layer 8056 form a source node SRAM PSD layer 8062. Dopants in a drain side of the SRAM PLDD layers 8030 and in the drain node SRAM PSD implanted layer 8054 form a drain node SRAM PSD layer 8064. One or more layers of metal silicide, not shown, such as nickel silicide or cobalt silicide may be subsequently formed on exposed surfaces of the source and drain layers 8058, 8060, 8062 and 8064 and/or exposed surfaces of the gates 8016, 8022 and 8028 and the gate extension 8032.

A PMD layer 8066 is formed over an existing top surface of the integrated circuit 8000 as described in reference to FIG. 1E. A stretch contact 8068 is formed in the PMD layer 8066 which contacts the SRAM gate extension 8032 and the drain node SRAM PSD layer 8064, as described in reference to FIG. 1E. Performing the localized SRAM PSD ion implant process as described in reference to FIG. 8A provides sufficient p-type dopants to the SRAM PMOS drain region 8042 so that a depth of the drain node SRAM PSD layer 8064 is at least 75 percent of the maximum depth of the drain node SRAM PSD layer 8064 under every point of contact between the stretch contact 8068 and the drain node SRAM PSD layer 8064.

FIG. 9A and FIG. 9B are cross sections of an integrated circuit containing an SAR SRAM cell and separate CMOS transistors, formed according to another embodiment, depicted in successive stages of fabrication. Referring to FIG. 9A, the integrated circuit 9000 is formed in and on a substrate 9002 as described in reference to FIG. 1A. The integrated circuit 9000 includes an SAR SRAM area 9004 and a separate CMOS area 9006. The SAR SRAM area 9004 includes an SRAM PMOS area 9008 and an SRAM NMOS area 9010. Field oxide 9012 is formed in the SRAM PMOS area 9008 as described in reference to FIG. 1A. In the CMOS area 9006, a logic PMOS gate dielectric layer 9014, a logic PMOS gate 9016 and possibly logic PLDD layers 9018 are formed in and on the substrate 9002. In the SRAM NMOS area 9010, an SRAM NMOS gate dielectric layer 9020, an SRAM NMOS gate 9022 and possibly SRAM NLDD layers 9024 are formed in and on the substrate 9002. In the SRAM PMOS area 9008, an SRAM PMOS gate dielectric layer 9026, an SRAM PMOS gate 9028 and possibly SRAM PLDD layers 9030 are formed in and on the substrate 9002, and an SRAM gate extension 9032 is formed on the field oxide 9012.

Logic PMOS sidewall spacers 9034 are formed adjacent to the logic PMOS gate 9016, SRAM NMOS sidewall spacers 9036 are formed adjacent to the SRAM NMOS gate 9022, SRAM PMOS sidewall spacers 9038 are formed adjacent to the SRAM PMOS gate 9028, and SRAM gate extension sidewall spacers 9040 are formed adjacent to the SRAM gate extension 9032, as described in reference to FIG. 4A and FIG. 4B. The SRAM gate extension sidewall spacer 9040 adjacent to the SRAM PMOS gate 9028 may partially overlap an SRAM PMOS drain region 9042 in the substrate 9002 between the SRAM PMOS gate 9028 and the SRAM gate extension 9032 adjacent to the field oxide 9012.

A localized SRAM PSD ion implant mask 9044 is formed over an existing top surface of the integrated circuit 9000, as described in reference to FIG. 7A. In the instant embodiment, the localized SRAM PSD ion implant mask 9044 exposes the SRAM PMOS area 9008, and covers the CMOS area 9006 and the SRAM NMOS area 9010. An SRAM PSD ion implant process is performed on the integrated circuit 9000 which implants p-type dopants such as boron or gallium into the substrate in the SRAM PMOS area 9008 to form an SRAM PMOS drain extra-implanted layer 9046 and a source node SRAM PSD implanted layer 9048. In one version of the instant embodiment, the SRAM PSD ion implant process may implant boron at a dose between $3 \times 10^{15}$ atoms/cm$^2$ and $1 \times 10^{16}$ atoms/cm$^2$, at an energy between 2 keV and 4 keV. In an alternate version, the localized SRAM PSD ion implant process may implant BF$_2$ at a dose between $2 \times 10^{15}$ molecules/cm$^2$ and $5 \times 10^{15}$ molecules/cm$^2$, at an energy between 5 keV and 20 keV. In another version, the SRAM PSD ion implant process may implant boron at a dose at least 150 percent of a subsequent PSD ion implant process which forms PSD layers in the CMOS area 9006. The localized SRAM PSD ion implant mask 9044 blocks dopants from the SRAM PSD ion implant process in the CMOS area 9006 and the SRAM NMOS area 9010. After the SRAM PSD ion implant process is completed, the localized SRAM PSD ion implant mask 9044 is removed.

Referring to FIG. 9B, a PSD ion implant mask 9050 is formed over an existing top surface of the integrated circuit 9000 so as to expose PMOS transistors in the CMOS area 9006. A PSD ion implant process is performed on the integrated circuit which implants p-type dopants, at a lower dose than the SRAM PSD ion implant process, into the substrate to form p-type logic PSD implanted layers 9052 adjacent to the logic PMOS gate 9016. In one version of the instant embodiment, the PSD ion implant process may implant boron at a dose between $4 \times 10^{15}$ atoms/cm$^2$ and $8 \times 10^{15}$ atoms/cm$^2$, at an energy between 2 keV and 4 keV. In another version, the PSD ion implant process may implant boron at a dose no more than 66 percent of the SRAM PSD ion implant process. The p-type dopants of the PSD ion implant process are blocked from the SAR SRAM area 9004 by the PSD ion implant mask 9050.

After the PSD ion implant process is completed, the PSD ion implant mask 9050 is removed.

Referring to FIG. 9C, NSD implanted layers, not shown, are formed in the substrate 9002 adjacent to the SRAM NMOS gate 9022. A source/drain anneal operation is performed on the integrated circuit 9000 as described in reference to FIG. 7C which heats the substrate 9002 so as to electrically activate at least a portion of the dopants in the logic PSD implanted layers 9052, the drain node SRAM PSD implanted layer 9046 and the source node SRAM PSD implanted layer 9048 of FIG. 9B and the NSD implanted layers. Dopants in the logic PLDD layers 9018 and the logic PSD implanted layers 9052 form logic PSD layers 9054. Dopants in the SRAM NLDD layers 9024 and the NSD implanted layers form SRAM NSD layers 9056. Dopants in a source side of the SRAM PLDD layers 9030 and in the source node SRAM PSD implanted layer 9048 form a source node SRAM PSD layer 9058. Dopants in a drain side of the SRAM PLDD layers 9030 and in the drain node SRAM PSD implanted layer 9046 form a drain node SRAM PSD layer 9060. One or more layers of metal silicide, not shown, such as nickel silicide or cobalt silicide may be subsequently formed on exposed surfaces of the source and drain layers 9054, 9056, 9058 and 9060 and/or exposed surfaces of the gates 9016, 9022 and 9028 and the gate extension 9032.

A PMD layer 9062 is formed over an existing top surface of the integrated circuit 9000 as described in reference to FIG. 1E. A stretch contact 9064 is formed in the PMD layer 9062 which contacts the SRAM gate extension 9032 and the drain node SRAM PSD layer 9060, as described in reference to FIG. 1E. Performing the SRAM PSD ion implant process as described in reference to FIG. 9A provides sufficient p-type dopants to the SRAM PMOS drain region 9042 so that a depth of the drain node SRAM PSD layer 9060 is at least 75 percent of the maximum depth of the drain node SRAM PSD layer 9060 under every point of contact between the stretch contact 9064 and the drain node SRAM PSD layer 9060.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
    providing a semiconductor substrate;
    forming an element of field oxide at a top surface of said substrate in an SRAM PMOS area of an SAR SRAM area of said integrated circuit;
    forming a logic PMOS gate dielectric layer on said substrate in a CMOS area of said integrated circuit, said CMOS area being separate from said SAR SRAM area;
    forming an SRAM NMOS gate dielectric layer on said substrate in an SRAM NMOS area of said SAR SRAM area;
    forming an SRAM PMOS gate dielectric layer on said substrate proximate to said field oxide in said SRAM PMOS area;
    forming a logic PMOS gate on said logic PMOS gate dielectric layer;
    forming an SRAM NMOS gate on said SRAM NMOS gate dielectric layer;
    forming an SRAM PMOS gate on said SRAM PMOS gate dielectric layer;
    forming an SRAM gate extension on said field oxide;
    forming a conformal layer of sidewall spacer material over an existing top surface of said integrated circuit;
    forming a localized SRAM etchback mask over said layer of sidewall spacer material so as to expose said layer of sidewall spacer material layer at said SRAM gate extension and at said substrate in an SRAM PMOS drain region between said SRAM PMOS gate and said field oxide;
    performing a localized etchback process on said integrated circuit which removes between 3 and 30 nanometers of said sidewall spacer material in an area exposed by said localized SRAM etchback mask;
    removing said localized SRAM etchback mask;
    performing a sidewall spacer etch process on said integrated circuit which removes sidewall spacer material from said layer of sidewall spacer material and leaves sidewall spacer material on vertical surfaces at said logic PMOS gate, said SRAM NMOS gate, said SRAM PMOS gate and said SRAM gate extension to form:
        logic PMOS sidewall spacers adjacent to said logic PMOS gate;
        SRAM NMOS sidewall spacers adjacent to said SRAM NMOS gate;
        SRAM PMOS sidewall spacers adjacent to said SRAM PMOS gate and
        SRAM gate extension sidewall spacers adjacent to said SRAM gate extension;
    forming p-type logic PSD layers in said substrate adjacent to said logic PMOS gate;
    forming n-type SRAM NSD layers in said substrate adjacent to said SRAM NMOS gate;
    forming a p-type drain node SRAM PSD layer in said substrate in said SRAM PMOS drain region;
    forming a p-type source node SRAM PSD layer in said substrate adjacent to said SRAM PMOS gate opposite from said drain node SRAM PSD layer;
    forming a PMD layer over an existing top surface of said integrated circuit; and
    forming a stretch contact in said PMD layer which overlaps and makes electrical contact to said drain node SRAM PSD layer and said SRAM gate extension;
    so that:
        a width of said SRAM gate extension sidewall spacer adjacent to said SRAM PSD drain layer is between 3 and 20 nanometers less than a width of said logic PMOS sidewall spacers; and
        a depth of said drain node SRAM PSD layer is at least 75 percent of a maximum depth of said drain node SRAM PSD layer under every point of contact between said stretch contact and said drain node SRAM PSD layer.

2. The process of claim 1, in which said width of said SRAM gate extension sidewall spacer adjacent to said SRAM PSD drain layer is between 10 and 50 percent less than said width of said logic PMOS sidewall spacers.

3. The process of claim 1, in which said step of performing said localized etchback process is performed prior to said step of performing said sidewall spacer etch process.

4. The process of claim 3, in which said localized SRAM etchback mask exposes said SRAM PMOS gate.

5. The process of claim 3, in which said localized SRAM etchback mask exposes said SRAM PMOS gate and said SRAM NMOS gate.

6. The process of claim 1, in which said step of performing said sidewall spacer etch process is performed prior to said step of forming said localized SRAM etchback mask.

7. The process of claim 6, further including a step of ion implanting p-type dopants into said substrate in said SRAM PMOS drain region, performed after said step of performing said localized etchback process and prior to removing said localized SRAM etchback mask.

8. The process of claim 7, in which said step of ion implanting p-type dopants into said substrate in said SRAM PMOS drain region includes implanting boron at a dose between $2 \times 10^{15}$ atoms/cm$^2$ and $5 \times 10^{15}$ atoms/cm$^2$, at an energy between 2 keV and 4 keV.

9. The process of claim 7, in which said step of ion implanting p-type dopants into said substrate in said SRAM PMOS drain region includes implanting boron at a dose of at least 50 percent of a dose used to form said logic PSD layers.

10. The process of claim 6, in which said localized SRAM etchback mask exposes said SRAM PMOS gate.

11. The process of claim 6, in which said localized SRAM etchback mask exposes said SRAM PMOS gate and said SRAM NMOS gate.

12. A process of forming an integrated circuit, comprising the steps:
providing a semiconductor substrate;
forming an element of field oxide at a top surface of said substrate in an SRAM PMOS area of an SAR SRAM area of said integrated circuit;
forming a logic PMOS gate dielectric layer on said substrate in a CMOS area of said integrated circuit, said CMOS area being separate from said SAR SRAM area;
forming an SRAM NMOS gate dielectric layer on said substrate in an SRAM NMOS area of said SAR SRAM area;
forming an SRAM PMOS gate dielectric layer on said substrate proximate to said field oxide in said SRAM PMOS area;
forming a logic PMOS gate on said logic PMOS gate dielectric layer;
forming an SRAM NMOS gate on said SRAM NMOS gate dielectric layer;
forming an SRAM PMOS gate on said SRAM PMOS gate dielectric layer;
forming an SRAM gate extension on said field oxide;
forming a conformal layer of sidewall spacer material over an existing top surface of said integrated circuit;
performing a sidewall spacer etch process on said integrated circuit which removes sidewall spacer material from said layer of sidewall spacer material and leaves sidewall spacer material on vertical surfaces at said logic PMOS gate, said SRAM NMOS gate, said SRAM PMOS gate and said SRAM gate extension to form:
logic PMOS sidewall spacers adjacent to said logic PMOS gate;
SRAM NMOS sidewall spacers adjacent to said SRAM NMOS gate;
SRAM PMOS sidewall spacers adjacent to said SRAM PMOS gate and
SRAM gate extension sidewall spacers adjacent to said SRAM gate extension;
forming a localized SRAM PSD ion implant mask over an existing top surface of said integrated circuit so that at least a portion of an SRAM PMOS drain region between said SRAM PMOS gate and said field oxide is exposed and said logic PMOS gate is covered;
performing a localized SRAM PSD ion implant process on said integrated circuit which implants p-type dopants into said substrate in said SRAM PMOS drain region to form an SRAM PMOS drain extra-implanted layer;
forming a PSD ion implant mask over an existing top surface of said integrated circuit so that at least said substrate adjacent to said logic PMOS gate is exposed;
performing a PSD ion implant process on said integrated circuit which implants p-type dopants into said substrate adjacent to said logic PMOS gate to form logic PSD implanted layers;
performing a source/drain anneal operation on said integrated circuit which heats said substrate so as to electrically activate at least a portion of said dopants in said logic PSD implanted layers and said drain node SRAM PSD extra-implanted layer;
forming a PMD layer over an existing top surface of said integrated circuit; and
forming a stretch contact in said PMD layer which overlaps and makes electrical contact to said drain node SRAM PSD layer and said SRAM gate extension, so that a depth of said drain node SRAM PSD layer is at least 75 percent of a maximum depth of said drain node SRAM PSD layer under every point of contact between said stretch contact and said drain node SRAM PSD layer.

13. The process of claim 12, in which said step of performing said localized SRAM PSD ion implant process includes implanting boron at a dose of at least 50 percent of a dose used in said step of performing said PSD ion implant process.

14. The process of claim 12, in which said step of performing said localized SRAM PSD ion implant process includes implanting boron at a dose between $2 \times 10^{15}$ atoms/cm$^2$ and $5 \times 10^{15}$ atoms/cm$^2$, at an energy between 2 keV and 4 keV.

15. The process of claim 12, in which:
said localized SRAM PSD ion implant mask exposes said substrate adjacent to said SRAM PMOS gate; and
said PSD ion implant mask exposes said substrate adjacent to said SRAM PMOS gate.

16. The process of claim 15, in which said step of performing said localized SRAM PSD ion implant process includes implanting boron at a dose of at least 50 percent of a dose used in said step of performing said PSD ion implant process.

17. The process of claim 15, in which said step of performing said localized SRAM PSD ion implant process includes implanting boron at a dose between $2 \times 10^{15}$ atoms/cm$^2$ and $5 \times 10^{15}$ atoms/cm$^2$, at an energy between 2 keV and 4 keV.

18. The process of claim 12, in which:
said localized SRAM PSD ion implant mask exposes said substrate adjacent to said SRAM PMOS gate;
said PSD ion implant mask covers said substrate adjacent to said SRAM PMOS gate; and
said step of performing said PSD ion implant process includes implanting boron at a dose of no more than 66 percent of a dose used in said step of performing said localized SRAM PSD ion implant process.

* * * * *